United States Patent
Morita

(10) Patent No.: US 12,342,527 B2
(45) Date of Patent: Jun. 24, 2025

(54) CONDUCTIVE LAYERS IN MEMORY ARRAY REGION AND METHODS FOR FORMING THE SAME

(71) Applicant: Micron Technology, Inc., Boise, ID (US)

(72) Inventor: Kohei Morita, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 324 days.

(21) Appl. No.: 17/395,020

(22) Filed: Aug. 5, 2021

(65) Prior Publication Data

US 2023/0040762 A1 Feb. 9, 2023

(51) Int. Cl.
*H10B 12/00* (2023.01)

(52) U.S. Cl.
CPC ....... *H10B 12/315* (2023.02); *H10B 12/0335* (2023.02); *H10B 12/09* (2023.02); *H10B 12/482* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 10,770,465 B1* | 9/2020 | Kim | H10B 12/482 |
| 2017/0148799 A1* | 5/2017 | Basker | H01L 21/76831 |
| 2021/0351190 A1* | 11/2021 | Ho | H10B 12/482 |
| 2022/0293605 A1* | 9/2022 | Chiang | H10D 30/6755 |

* cited by examiner

*Primary Examiner* — Steven M Page
(74) *Attorney, Agent, or Firm* — Dorsey & Whitney LLP

(57) ABSTRACT

Apparatuses and methods for manufacturing semiconductor memory devices are described. An example method includes: forming a plurality of capacitor contacts on a substrate; forming a dielectric layer on the plurality of capacitor contacts; removing portions of the dielectric layer to form a plurality of openings in the dielectric layer; exposing the plurality of capacitor contacts at bottoms of the plurality of the corresponding openings; and depositing conductive material to form a plurality of interconnects in the plurality of corresponding openings.

5 Claims, 21 Drawing Sheets

CONDUCTIVE LAYERS IN MEMORY ARRAY REGION AND METHODS FOR FORMING THE SAME

BACKGROUND

High data reliability, high speed of memory access, lower power consumption and reduced chip size are features that are demanded from semiconductor memory. To reduce chip size, a distance between memory cells has become shorter.

Semiconductor devices include conductive layers, such as bit lines and redistribution layers (RDLs). An RDL refers to an interconnect layer that is used to redistribute terminals for a package with solder bumps and flip chip connections, for example. The RDLs provide signals on input/output pads of the devices to other locations. The RDLs are often disposed in an uppermost part of the semiconductor devices. The RDLs tend to be formed thick to have a low resistance.

Conventional methods of forming RDLs include forming metal films and dry etching the metal films using hard masks to isolate adjacent RDLs. However, in preparation for dry etching the metal films, a dielectric layer under the metal films is required to have a considerable thickness. The thickness of the dielectric layer increases a height of bit line structures. The bit line structures, as a result, tend to bend, which is undesirable.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
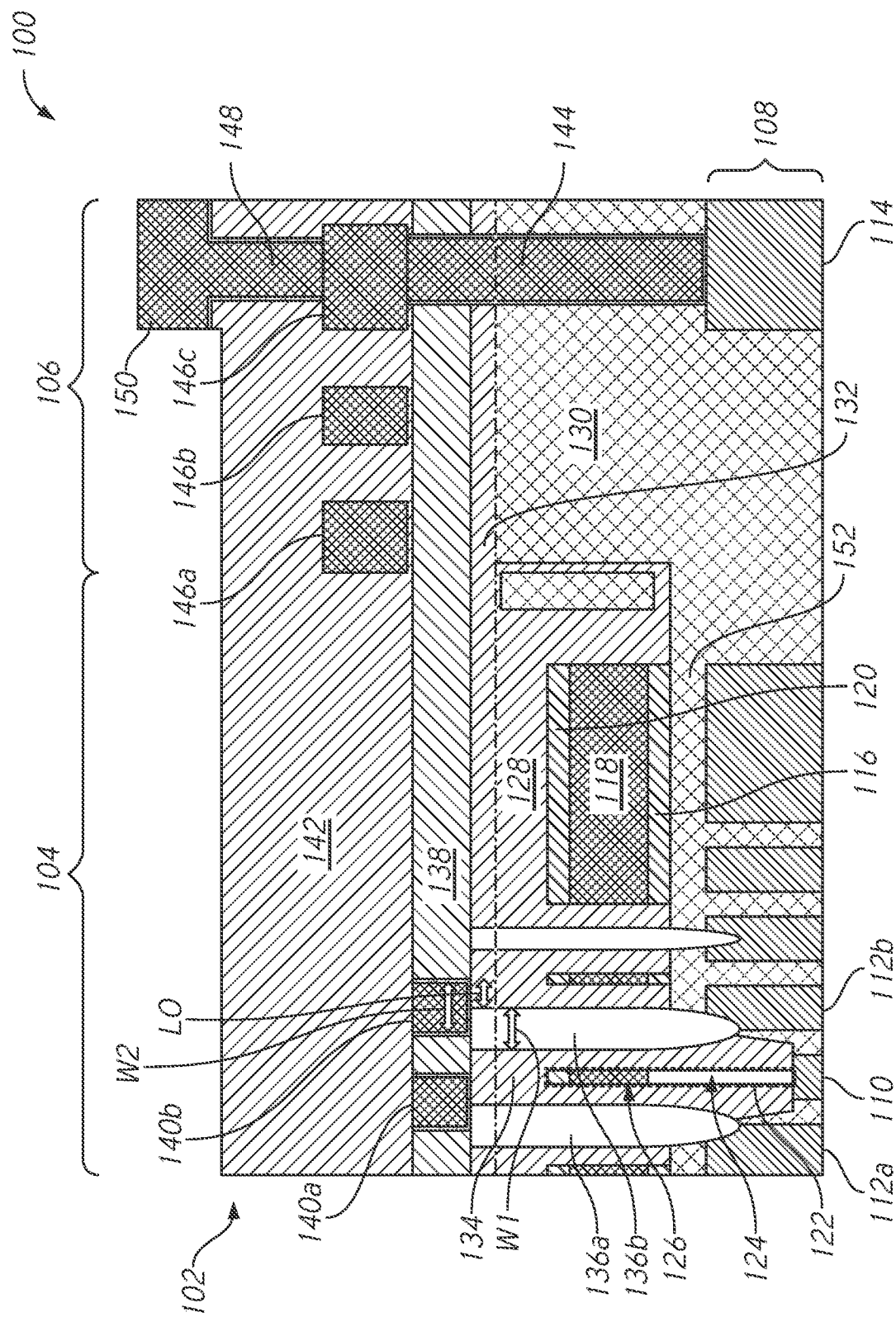
FIG. 1 is a diagram of a vertical cross-sectional view of one schematic structure of a portion of a semiconductor device in accordance with an embodiment of the present disclosure.

FIG. 1 is a diagram of a vertical cross-sectional view of one schematic structure of a portion 102 of a semiconductor device 100 in accordance with an embodiment of the present disclosure. In some embodiment, the semiconductor device 100 may be a memory device (e.g., a dynamic random access memory (DRAM)) including memory cells, for example. Each memory cell may include a transistor and a capacitor. The portion 102 may include the transistor, such as a metal-oxide-semiconductor field-effect transistor (MOSFET) in the DRAM, for example.

The portion 102 includes portions of a memory array region 104 and a peripheral region 106 of the semiconductor device 100. Memory cells may be disposed in the memory array region 104 and peripheral circuits may be disposed in the peripheral region 106. In some embodiments, the semiconductor device 100 may include a substrate 108 across the memory array region 104 and the peripheral region 106. The substrate 108 may include an active region 110, active regions 112a and 112b in the memory array region 104. The substrate 108 may include an active region 114 in the peripheral region 106. The portion 102 may include an isolation structure 152 covering the active regions 110, 112a, 112b and 114. The active regions 110, 112a, 112b and 114 may be isolated from one another by isolation structure 152. In some embodiments, the isolation structure 152 may be shallow trench isolation (STI) including dielectric material. The portion 102 may include a dielectric layer 116 on the substrate 108, a conductive layer 118 on the dielectric layer 116 and a dielectric layer 120 on the conductive layer 118 in the memory array region 104. The portion 102 may include a bit line structure 122 on the active region 110 of the substrate 108. The bit line structure 122 may include a bit line contact 124 on the active region 110 of the substrate 108, and further include a bit line 126 on the bit line contact 124. In some embodiments, the bit line contact 124 may be provided on a top surface of the substrate 108. In some embodiments, the top surface of the substrate 108 under the bit line contact 124 may have a height less than a thickness of the rest of the substrate 108. In some embodiments, the bit line 126 may be a portion of the conductive layer 118. The portion 102 may also include a dielectric layer 128 above the dielectric layer 120 in the memory array region 104. The portion 102 may also include a dielectric layer 130 in the peripheral region 106. The dielectric layer 130 may have a top surface having a same height from the substrate 108 as a height of a top surface of the dielectric layer 128. The portion 102 may include a dielectric layer 132 across the memory array region 104 and the peripheral region 106. The dielectric layer 132 may be disposed on the dielectric layers 128 and 130. The portion 102 may include capacitor contacts 136a and 136b on the active regions 112a and 112b respectively. In some embodiments, lower portions of the capacitor contacts 136a and 136b may be in the substrate 108. In some embodiments, top surfaces of the capacitor contacts 136a and 136b may have a same height from the substrate 108 as a top surface of the dielectric layer 132. The portion 102 may further include an insulator 134 around the bit structure 122. The bit structure 122 may be insulated from the capacitor contacts 136a and 136b by the insulator 134.

The portion 102 may include a dielectric layer 138 across the memory array region 104 and the peripheral region 106. In some embodiments, the dielectric layer 138 may be disposed on the dielectric layer 132 and the insulator 134. The portion 102 may include interconnects 140a and 140b in the dielectric layer 138. The interconnects 140a and 140b may be disposed on the capacitor contacts 136a and 136b with lateral offsets LO, respectively. Each of the interconnects 140a and 140b may have a width W2 that is greater than a width W1 of each of the capacitor contacts 136a and 136b. In some embodiments, the width W2 of the interconnects 140a and 140b may be substantially constant. The interconnects 140a and 140b may be coupled to the capacitor contacts 136a and 136b, respectively. The portion 102 may also include a via 144 disposed on the active region 114. The via 144 may be disposed through the dielectric layers 130, 132 and 138. The portion 102 may include a dielectric layer 142 across the memory array region 104 and the peripheral region 106. The portion 102 may include interconnects 146a, 146b and 146c in the dielectric layer 142. The interconnect 146c may be disposed on the via 144. The portion 102 may also include a via 148 in the dielectric layer 142. The via 148 may be disposed on the interconnect 146c. The portion 102 may further include an interconnect 150 disposed on the dielectric layer 142 and the via 148. Additional, fewer, and/or different components may be included in other examples.

The following describes methods of forming apparatuses, such as a semiconductor memory device 100 according to the embodiments with reference to FIG. 2 to FIG. 14. In some embodiments, conductive layers may be redistribution layers (RDLs). The dimensions and the ratios of dimensions of each portion in each drawing do not necessarily coincide with the dimensions and the ratios of dimensions of the actual semiconductor device.

Figure 2:
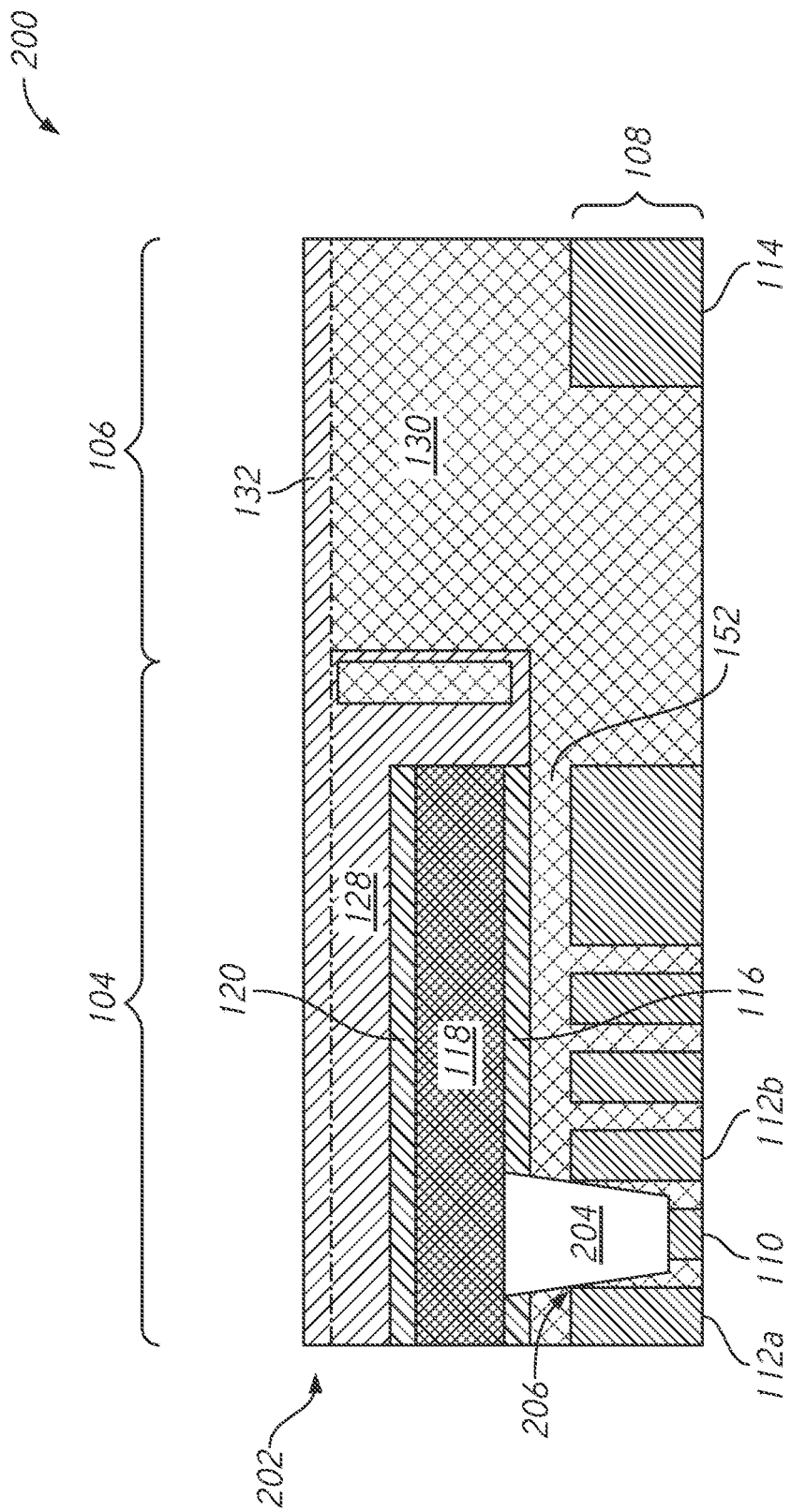
FIG. 2 is a diagram of a vertical cross-sectional view of one schematic structure of a portion of a semiconductor device in accordance with an embodiment of the present disclosure.

FIG. 2 is a diagram of a vertical cross-sectional view of one schematic structure of a portion 202 of a semiconductor device 200 in accordance with an embodiment of the present disclosure. In some embodiments, the portion 202 of the semiconductor device 200 may be an intermediate structure that is used to fabricate the portion 102 of the semiconductor device 100 of FIG. 1. The portion 202 includes portions of a memory array region 104 and a peripheral region 106 of the semiconductor device 200. In some embodiments, the semiconductor device 200 may include a substrate 108 across the memory array region 104 and the peripheral region 106. In some embodiments, the substrate 108 may include a single-crystal silicon, for example. In the following description, above is oriented with the substrate 108 at a bottom of the portion 102. The substrate 108 may include an active region 110 and active regions 112a and 112b in the memory array region 104. The substrate 108 may include an active region 114 in the peripheral region 106. The portion 202 may include an isolation structure 152 covering the active regions 110, 112a, 112b and 114. The active regions 110, 112a, 112b and 114 may be isolated from one another by isolation structure 152. In some embodiments, the isolation structure 152 may be shallow trench isolation (STI) including dielectric material. In some embodiments, the dielectric material may include silicon oxide ($SiO_2$). A dielectric layer 116 may be formed on the isolation structure 152 of substrate 108. In some embodiments, the dielectric layer 116 may include dielectric material. The dielectric material may include, for example, silicon nitride (SiN). The dielectric material may be deposited by physical vapor deposition (PVD) or chemical vapor deposition (CVD).

After forming the dielectric layer 116, a portion of the dielectric layer 116 and a portion of the substrate 108, including a portion of the active region 110 and a portion of the isolation structure 152 around the active region 110 may be removed. In some embodiments, the removal of the portions of the dielectric layer 116 and the substrate 108 may be performed by etching. Thus, an opening 206 may be formed in the dielectric layer 116 and the substrate 108. A conductive material 204 may be deposited to fill the opening 206. In some embodiments, the conductive material 204 may include, for example, polycrystalline silicon (poly-Si). In some embodiments, the conductive material 204 may be deposited by physical vapor deposition (PVD), for example, sputtering the conductive material. In some embodiments, the conductive material 204 may be deposited by chemical vapor deposition (CVD). A conductive layer 118 may be formed on the dielectric layer 116 and the conductive material 204 in the memory array region 104. The conductive layer 118 may include conductive material. In some embodiments, the conductive material may include tungsten (W). The conductive layer 118 may be deposited by physical vapor deposition (PVD), for example, sputtering the conductive material. A dielectric layer 120 may be deposited on the conductive layer 118 in the memory array region 104. The dielectric layer 120 may include dielectric material. The dielectric material may include, for example, silicon nitride (SiN). The dielectric material may be deposited by physical vapor deposition (PVD). The portion 102 may also include a dielectric layer 128 formed above the dielectric layer 120 in the memory array region 104. In some embodiments, the dielectric layer 128 may include dielectric material. The dielectric material may include, for example, silicon nitride (SiN). The dielectric material may be deposited by physical vapor deposition (PVD) or chemical vapor deposition (CVD). The portion 102 may also include a dielectric layer 130 in the peripheral region 106. In some embodiments, the dielectric layer 130 may include dielectric material, such as silicon dioxide ($SiO_2$). In some embodiments, the dielectric material may be Spin on Dielectrics (SOD). The dielectric layer 130 may have a top surface having a same height from the substrate 108 as a height of a top surface of the dielectric layer 128. The top surfaces of the dielectric layers 128 and 130 may be adjacent to each other. The portion 102 may include a dielectric layer 132 across the memory array region 104 and the peripheral region 106. The dielectric layer 132 may be disposed on the dielectric layers 128 and 130. In some embodiments, the dielectric layer 132 may include dielectric material. The dielectric material may include, for example, silicon nitride (SiN). The dielectric material may be deposited by physical vapor deposition (PVD) or chemical vapor deposition (CVD). In some embodiments, a thickness of the dielectric layer 132 may be less than a height of the interconnects 140a and 140b.

Figure 3:
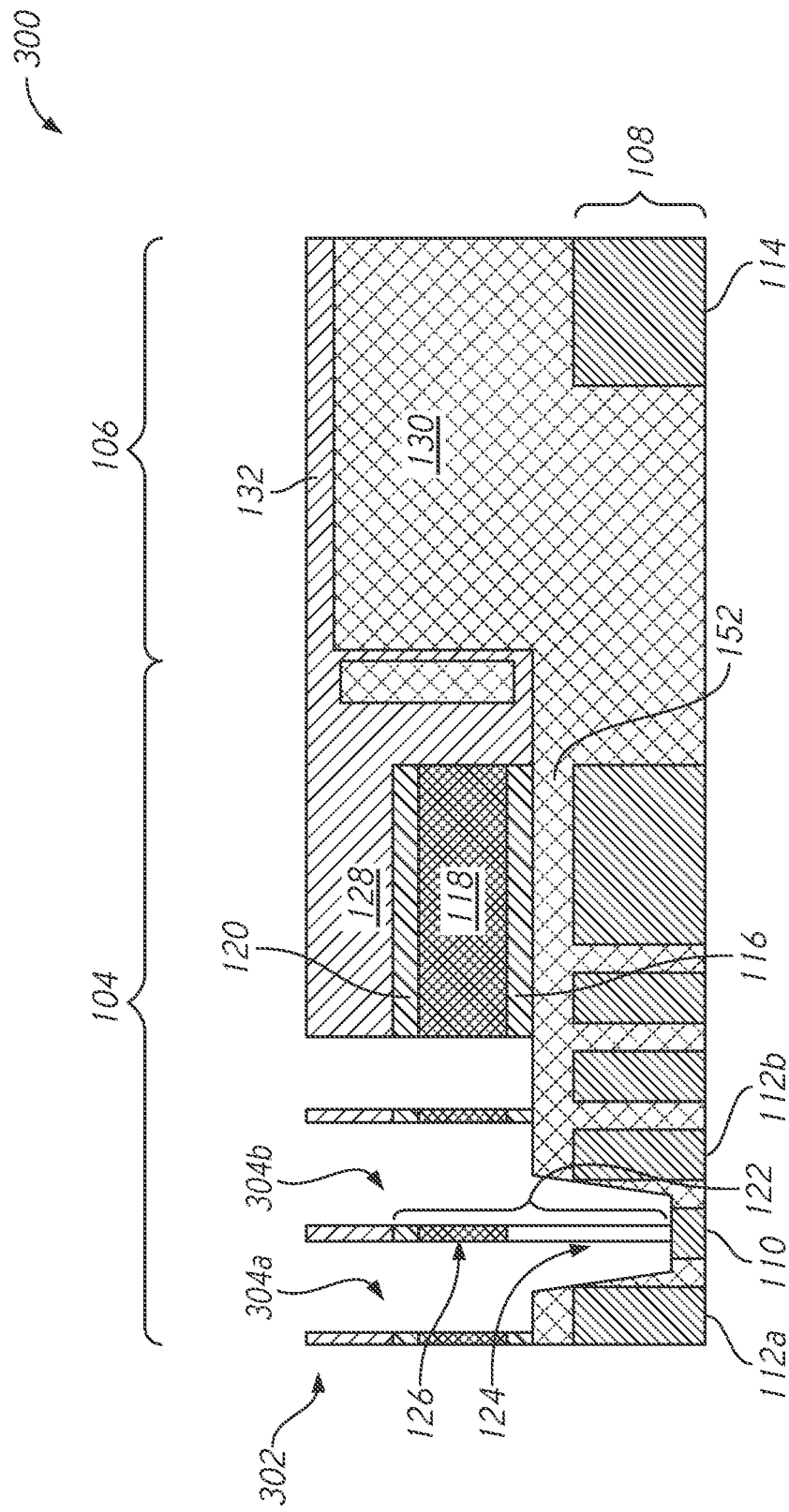
FIG. 3 is a diagram of a vertical cross-sectional view of one schematic structure of a portion of a semiconductor device in accordance with an embodiment of the present disclosure.

FIG. 3 is a diagram of a vertical cross-sectional view of one schematic structure of a portion 302 of a semiconductor device 300 in accordance with an embodiment of the present disclosure. In some embodiments, the portion 302 of the semiconductor device 300 may be an intermediate structure that is used to fabricate the portion 102 of the semiconductor device 100 of FIG. 1. In some embodiments, the portion 302 of the semiconductor device 300 may be fabricated by performing one or more fabrication processes on the portion 202 of the semiconductor device 200 of FIG. 2. The portion 302 may include openings 304a and 304b and a bit line structure 122 in the memory array region 104. A portion of the conductive material 204, portions of the dielectric layer 116, the conductive layer 118, the dielectric layer 120 and the dielectric layers 128 and 132 above the portion of the conductive material 204 may be removed to provide the openings 304a and 304b and provide the bit line structure 122 between the openings 304a and 304b. For example, using a lithography, a mask (not shown) may be disposed in a pattern of the bit line structure 122 that covers the dielectric layers 128 and 132 above the bit line structure 122. An area of the dielectric layer 132 not covered by the mask may be exposed for etching. Etching may be dry etching or wet etching, for example. In some embodiments, dry etching may be performed until the etching is stopped by the isolation structure 152 and the active region 110. Thus, the portions of the conductive material 204, the dielectric layer 116, the conductive layer 118, the dielectric layer 120 and the dielectric layers 128 and 132 not covered by the mask may be removed. In post-etching process (e.g., dry ashing and wet cleansing), the mask may be removed. The bit structure 122 may include a bit line contact 124 that is a portion of the conductive material 204 on the active region 110 and a bit line 126 that is a portion of the conductive layer 118 on the bit line contact 124.

Figure 4:
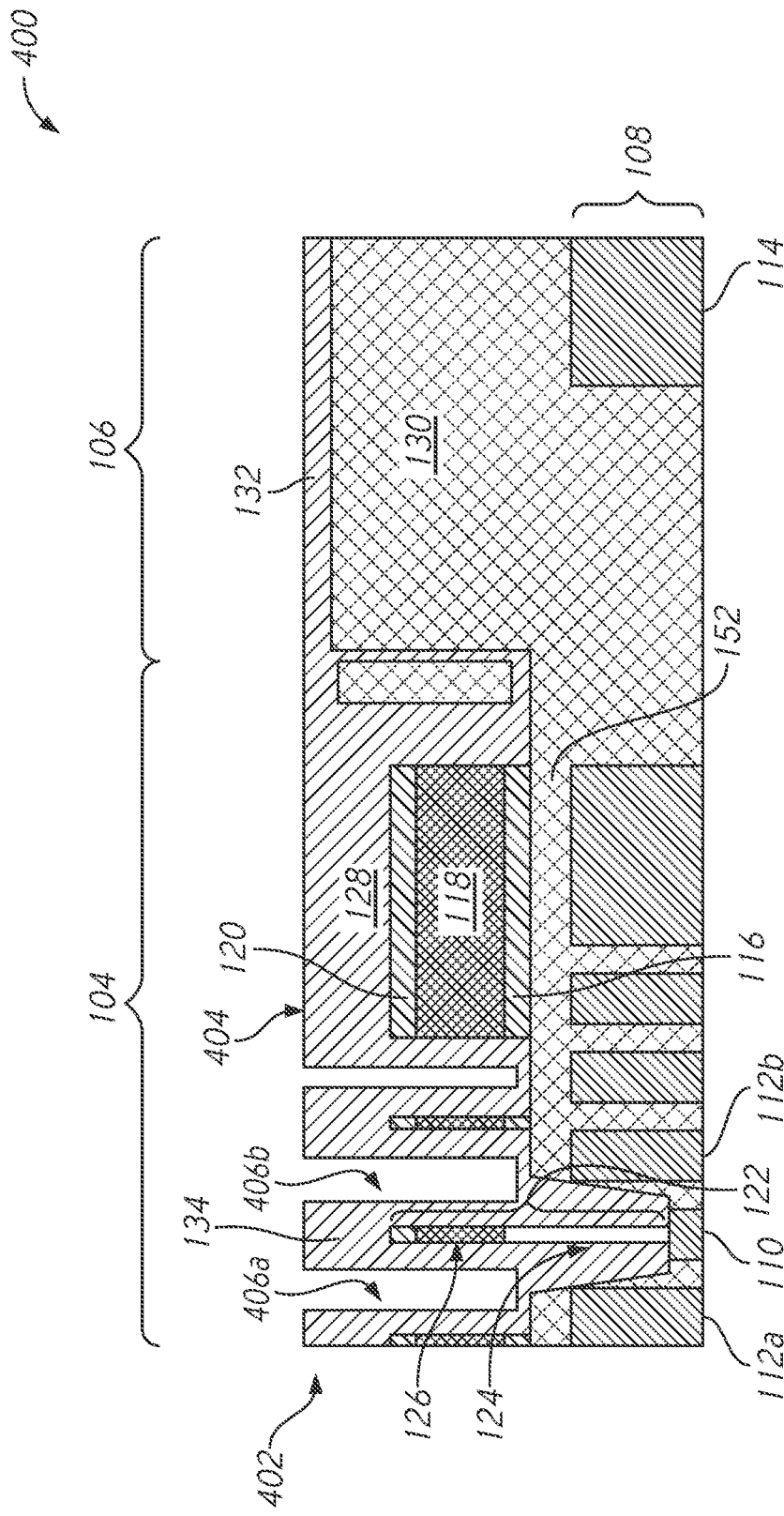
FIG. 4 is a diagram of a vertical cross-sectional view of one schematic structure of a portion of a semiconductor device in accordance with an embodiment of the present disclosure.

FIG. 4 is a diagram of a vertical cross-sectional view of one schematic structure of a portion 402 of a semiconductor device 400 in accordance with an embodiment of the present disclosure. In some embodiments, the portion 402 of the semiconductor device 400 may be an intermediate structure that is used to fabricate the portion 102 of the semiconductor device 100 of FIG. 1. In some embodiments, the portion 402 of the semiconductor device 400 may be fabricated by performing one or more fabrication processes on the portion 302 of the semiconductor device 300 of FIG. 3. The semiconductor device 400 may include a dielectric layer 404 disposed on the portion 302 of FIG. 3. The dielectric layer 404 may cover the dielectric layer 132 across the memory array region 104 and the peripheral region 106. The dielectric layer 404 may be deposited in the openings 304a and 304b in the memory array region 104 to cover an inner surface of the openings 304a and 304b. Thus, openings 406a and 406b may be formed. In some embodiments, the dielectric layer 404 may include dielectric material. The dielectric material may include, for example, silicon oxycarbide (SiOC), silicon oxide ($SiO_2$) or silicon nitride (SiN), or a combination thereof. The dielectric material may be deposited by physical vapor deposition (PVD) or chemical vapor deposition (CVD). In some embodiments, an insulator 134 covering the bit line structure 122 to insulate from the capacitor contacts 136a and 136b in FIG. 1 may include a portion of the dielectric layer 404 and a portion of the dielectric layer 128 above the bit structure 122.

Figure 5:
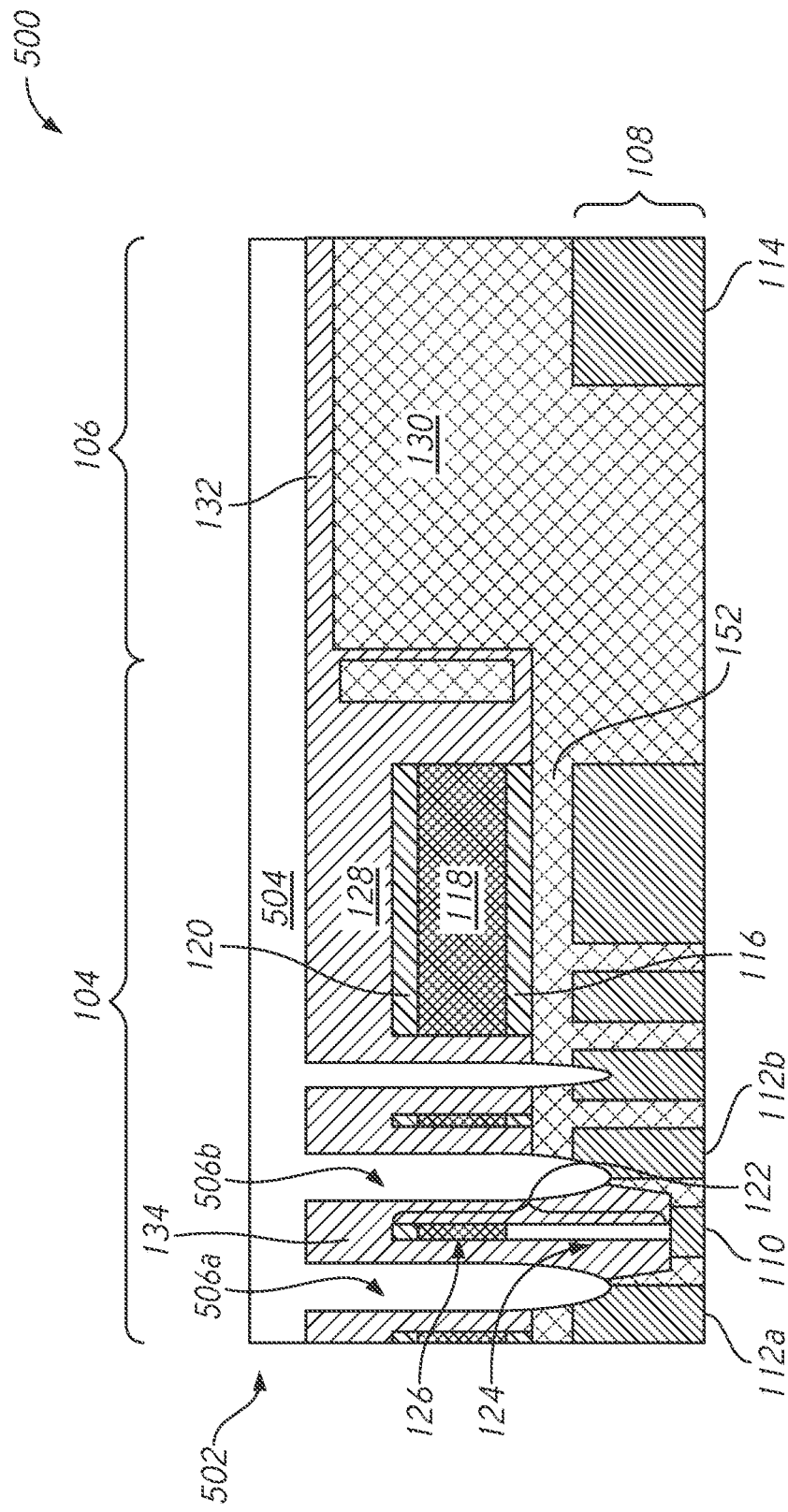
FIG. 5 is a diagram of a vertical cross-sectional view of one schematic structure of a portion of a semiconductor device in accordance with an embodiment of the present disclosure.

FIG. 5 is a diagram of a vertical cross-sectional view of one schematic structure of a portion 502 of a semiconductor device 500 in accordance with an embodiment of the present disclosure. In some embodiments, the portion 502 of the semiconductor device 500 may be an intermediate structure that is used to fabricate the portion 102 of the semiconductor device 100 of FIG. 1. In some embodiments, the portion 502 of the semiconductor device 500 may be fabricated by performing one or more fabrication processes on the portion 402 of the semiconductor device 400 of FIG. 4. The dielectric layer 404 on the dielectric layer 132 may be removed. The dielectric layer 404 at bottoms of the openings 406a and 406b may be removed by etching. Furthermore, the isolation structure 152 and the active regions 112a and 112b below the bottoms of the openings 406a and 406b may also be removed by etching. Thus, openings 506a and 506b on the active regions 112a and 112b may be formed. The openings 506a and 506b may be adjacent to the insulators 134. Conductive material 504 may be deposited on the dielectric layer 132 and on the insulator 134 to fill the openings 506a and 506b. In some embodiments, the conductive material 504 may include, for example, polycrystalline silicon (poly-Si). In some embodiments, the conductive material 504 may be deposited by physical vapor deposition (PVD), for example, sputtering the conductive material. In some embodiments, the conductive material 504 may be deposited by chemical vapor deposition (CVD).

Figure 6:
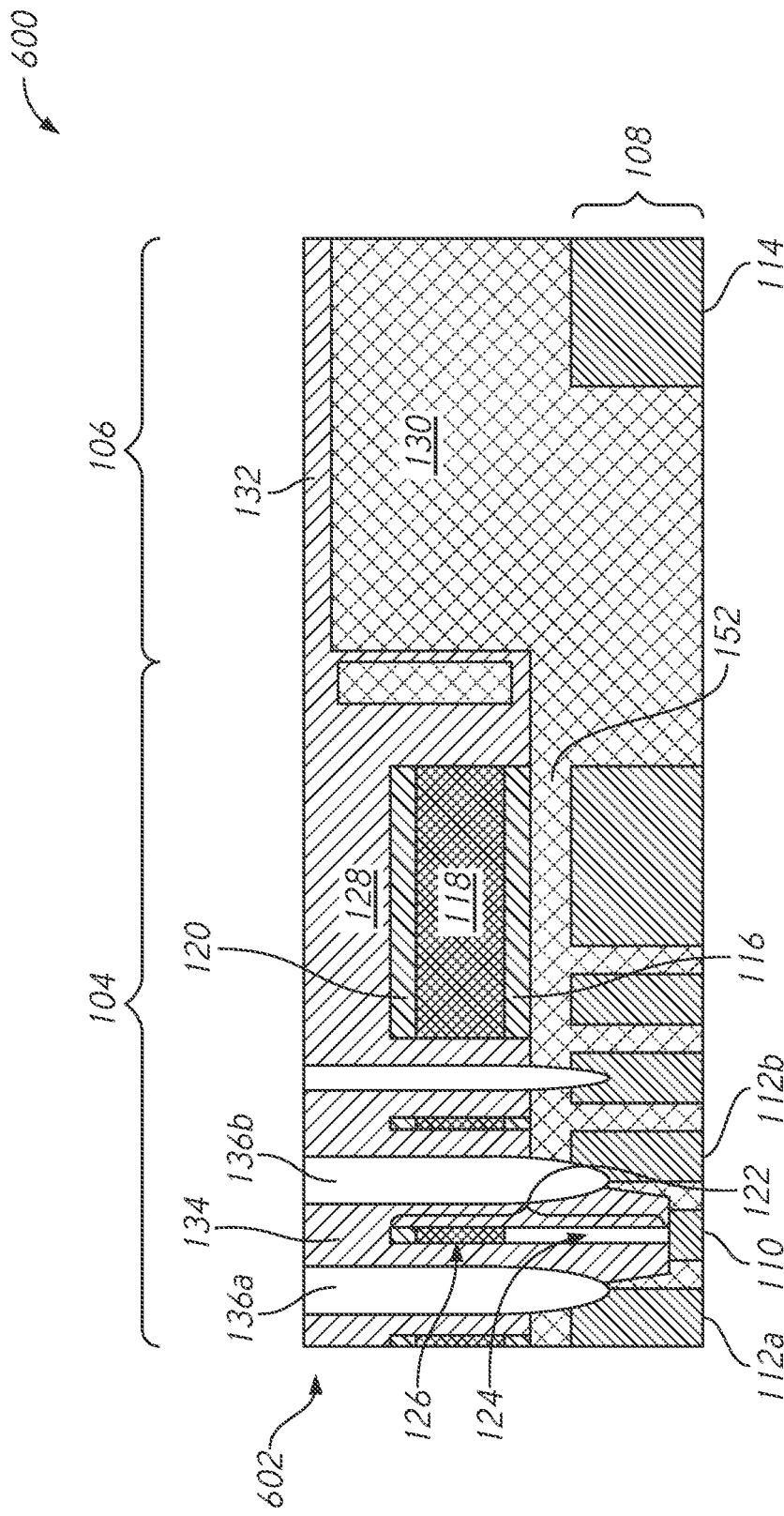
FIG. 6 is a diagram of a vertical cross-sectional view of one schematic structure of a portion of a semiconductor device in accordance with an embodiment of the present disclosure.

FIG. 6 is a diagram of a vertical cross-sectional view of one schematic structure of a portion 602 of a semiconductor device 600 in accordance with an embodiment of the present disclosure. In some embodiments, the portion 602 of the semiconductor device 600 may be an intermediate structure that is used to fabricate the portion 102 of the semiconductor device 100 of FIG. 1. In some embodiments, the portion 602 of the semiconductor device 600 may be fabricated by performing one or more fabrication processes on the portion 502 of the semiconductor device 500 of FIG. 5. The conductive material 504 above the dielectric layer 132 and the openings 506a and 506b may be removed. In some embodiments, the conductive material 504 may be removed by etching back the conductive material 504 above the dielectric layer 132 and the openings 506a and 506b. Thus, capacitor contacts 136a and 136b may be formed in the openings 506a and 506b. The capacitor contacts 136a and 136b may be coupled to the active regions 112a and 112b respectively. The capacitor contacts 136a and 136b may include conductive material, for example, polycrystalline silicon (poly-Si). Top surfaces of the capacitor contacts 136a and 136b may have the same height as a height of a top surface of the dielectric layer 132. As mentioned earlier referring to FIG. 5, the openings 506a and 506b may be formed after the isolation structure 152 and the active regions 112a and 112b below the bottoms of the openings 406a and 406b may also be removed by etching. Thus, in some embodiments, each of the capacitor contacts 136a and 136b may have a bottom portion in the substrate 108.

Figure 7:
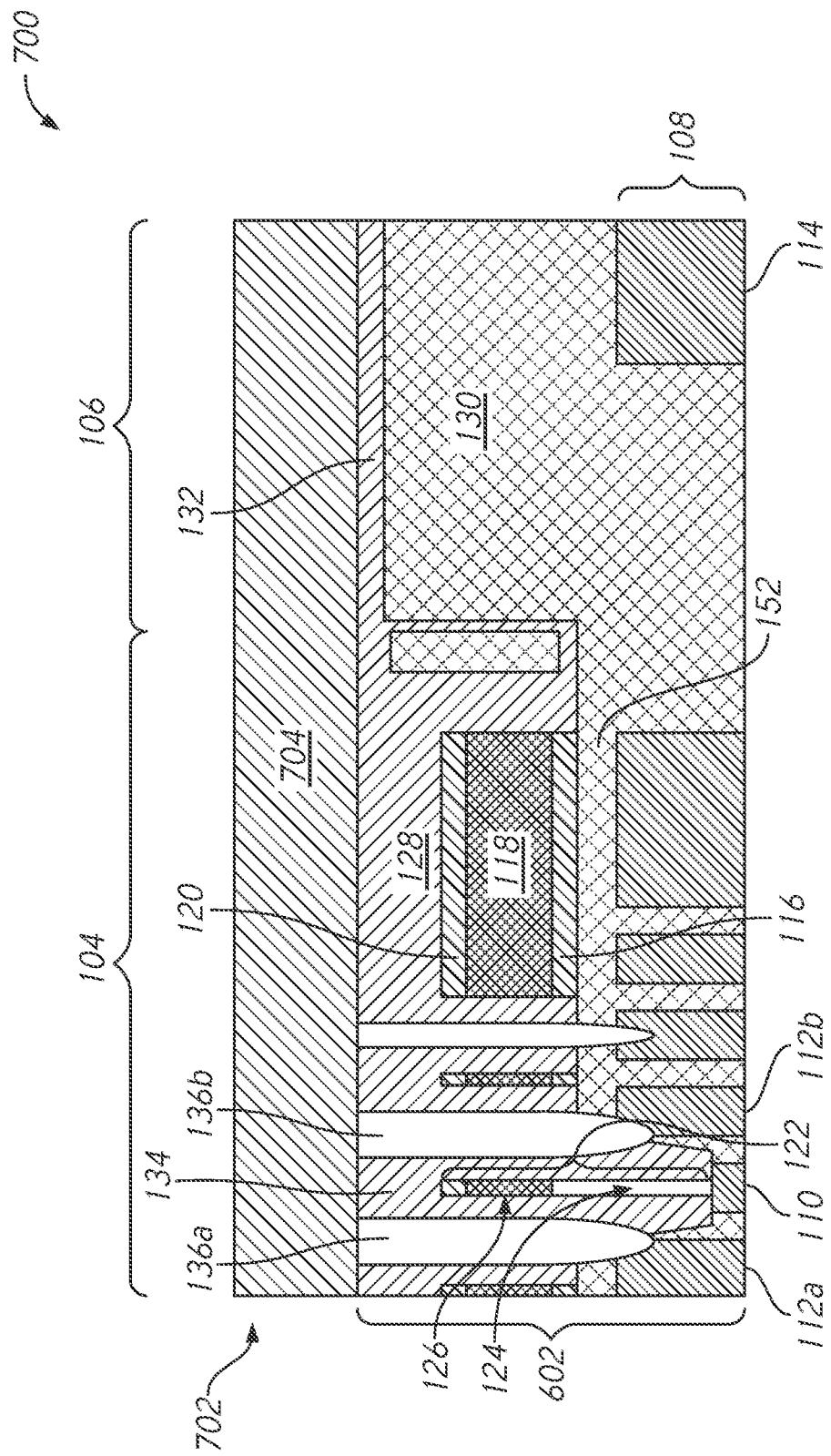
FIG. 7 is a diagram of a vertical cross-sectional view of one schematic structure of a portion of a semiconductor device in accordance with an embodiment of the present disclosure.

In some embodiments, a semiconductor device may include interconnects such as redistribution layers (RDLs). In some embodiments, the interconnects 140a and 140b in FIG. 1 may be formed in openings using a damascene process. The following describes methods of forming the interconnects 140a and 140b with reference to FIG. 7 to FIG. 10. FIG. 7 is a diagram of a vertical cross-sectional view of one schematic structure of a portion 702 of a semiconductor device 700 in accordance with an embodiment of the present disclosure. In some embodiments, the portion 702 of the semiconductor device 700 may be an intermediate structure that is used to fabricate the portion 102 of the semiconductor device 100 of FIG. 1. In some embodiments, the portion 702 of the semiconductor device 700 may be fabricated by performing one or more fabrication processes on the portion 602 of the semiconductor device 600 of FIG. 6. The portion 702 may include a dielectric layer 704 formed on the portion 602 of FIG. 6. In some embodiments, the dielectric layer 704 may be disposed on the dielectric layer 132, the capacitor contacts 136a and 136b and the insulator 134 between the capacitor contacts 136a and 136b. The dielectric layer 704 may include dielectric material. The dielectric material may include, for example, silicon nitride (SiN). The dielectric material may be deposited by physical vapor deposition (PVD) or chemical vapor deposition (CVD). In some embodiment, the dielectric layer 704 may be deposited by atomic layer deposition (ALD).

Figure 8:
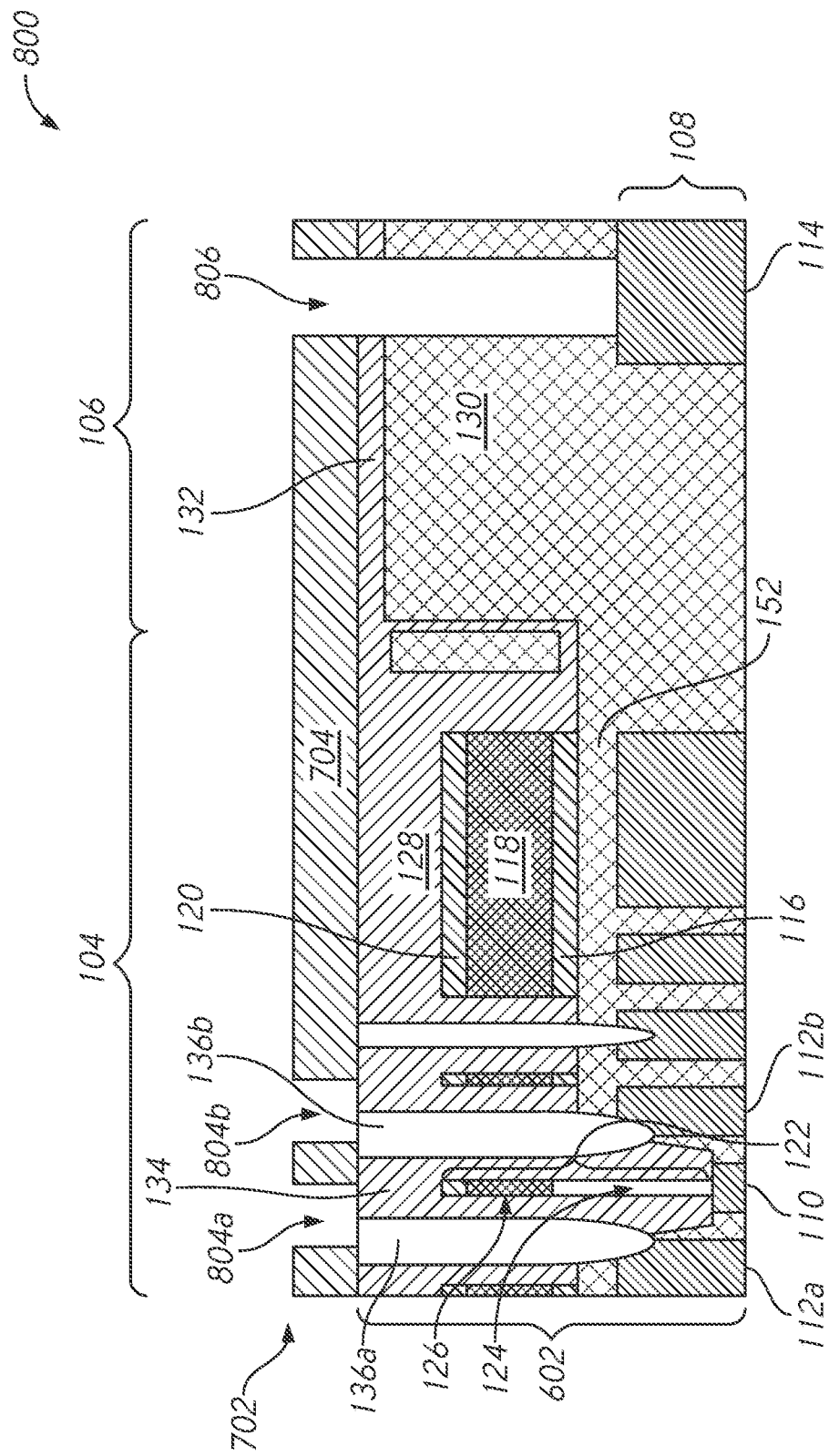
FIG. 8 is a diagram of a vertical cross-sectional view of one schematic structure of a portion of a semiconductor device in accordance with an embodiment of the present disclosure.

FIG. 8 is a diagram of a vertical cross-sectional view of one schematic structure of a portion 802 of a semiconductor device 800 in accordance with an embodiment of the present disclosure. In some embodiments, the portion 802 of the semiconductor device 800 may be an intermediate structure that is used to fabricate the portion 102 of the semiconductor device 100 of FIG. 1. In some embodiments, the portion 802 of the semiconductor device 800 may be fabricated by performing one or more fabrication processes on the portion 702 of the semiconductor device 700 of FIG. 7. Openings 804a and 804b may be provided in the dielectric layer 704 in the memory array region 104. In some embodiments, the openings 804a and 804b may be formed using photopatterning and dry-etching. The photopatterning may be performed to provide a pattern over the dielectric layer 704. The pattern allows etching portions of the dielectric layer 704 to provide the openings 804a and 804b with lateral offsets from the capacitor contacts 136a and 136b. The dry-etching of the dielectric layer 704 in the memory array region 104 may be performed until the capacitor contacts 136a and 136b are exposed at bottoms of the openings 804a and 804b. Thus, the openings 804a and 804b may be disposed above the capacitor contacts 136a and 136b with lateral offsets, respectively. In some embodiments, each of the openings 804a and 804b may have a substantially constant width. In some embodiments, through the openings 804a and 804b, ion implantation, such as ion implantation of germanium (Ge) into the capacitor contacts 136a and 136b may be performed.

An opening 806 may be formed in the peripheral region 106 through the dielectric layers 704, 132 and 130 above the active region 114. In some embodiments, a top surface of the dielectric layer 704 and inside the openings 804a and 804b may be covered by a mask. In some embodiments, amorphous carbon material, such as diamond-like carbon, may be deposited by chemical vapor deposition (CVD) to be the mask. The dry-etching in the peripheral region 106 may be performed to etch through the amorphous carbon material and the dielectric layers 704, 132 and 130 until the active region 114 is exposed. Thus, the opening 806 above the active region 114 may be formed.

Figure 9:
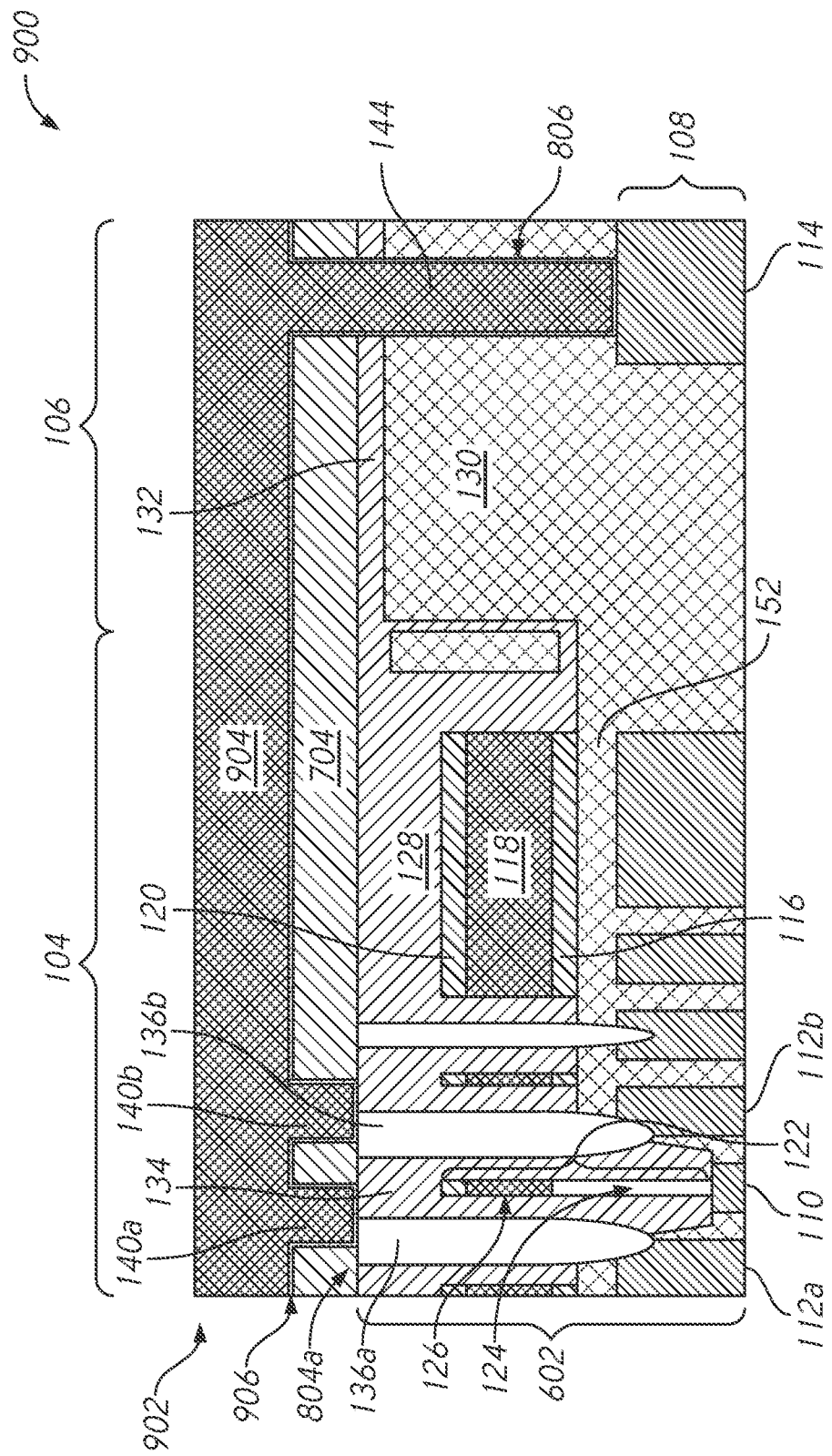
FIG. 9 is a diagram of a vertical cross-sectional view of one schematic structure of a portion of a semiconductor device in accordance with an embodiment of the present disclosure.

FIG. 9 is a diagram of a vertical cross-sectional view of one schematic structure of a portion 902 of a semiconductor device 900 in accordance with an embodiment of the present disclosure. In some embodiments, the portion 902 of the semiconductor device 900 may be an intermediate structure that is used to fabricate the portion 102 of the semiconductor device 100 of FIG. 1. In some embodiments, the portion 902 of the semiconductor device 900 may be fabricated by performing one or more fabrication processes on the portion 802 of the semiconductor device 800 of FIG. 8. In the openings 804a and 804b, interconnects 140a and 140b may be formed respectively. In the opening 806, a via 144 may be formed. In some embodiments, the interconnects 140a and 140b may be coupled to the capacitor contacts 136a and 136b of memory cells, respectively. The interconnects 140a and 140b may be disposed on the capacitor contacts 136a and 136b with lateral offsets, respectively. In some embodiments, each of the interconnects 140a and 140b may have a substantially constant width. The via 144 may be coupled to the active region 114. The interconnects 140a and 140b and the via 144 may include conductive material. The conductive material may include, for example, tungsten (W).

In some embodiments, to form the interconnects 140a, 140b and the via 144, a barrier layer 906 covering a top surface of the dielectric layer 704 and inner surfaces of the openings 804a, 804b and 806 may be formed. In some embodiments, the barrier layer 906 in the openings 804a and 804b may also be formed on the capacitor contacts 136a and 136b, respectively. The barrier layer 906 in the opening 806 may also be formed on the active region 114. In some embodiments, the barrier layer 906 may be deposited concurrently by physical vapor deposition (PVD) or chemical vapor deposition (CVD). In some embodiment, the barrier layer 906 may include conductive material, such as titanium nitride (TiN) or titanium (Ti), for example. The portion 902 may include conductive material 904 disposed on the barrier layer 906. The interconnects 140a and 140b and the via 144 may be included in the conductive material 904. In some embodiments, the conductive material 904 may be deposited by chemical vapor deposition (CVD). In some embodiments, the conductive material may include tungsten (W).

Figure 10:
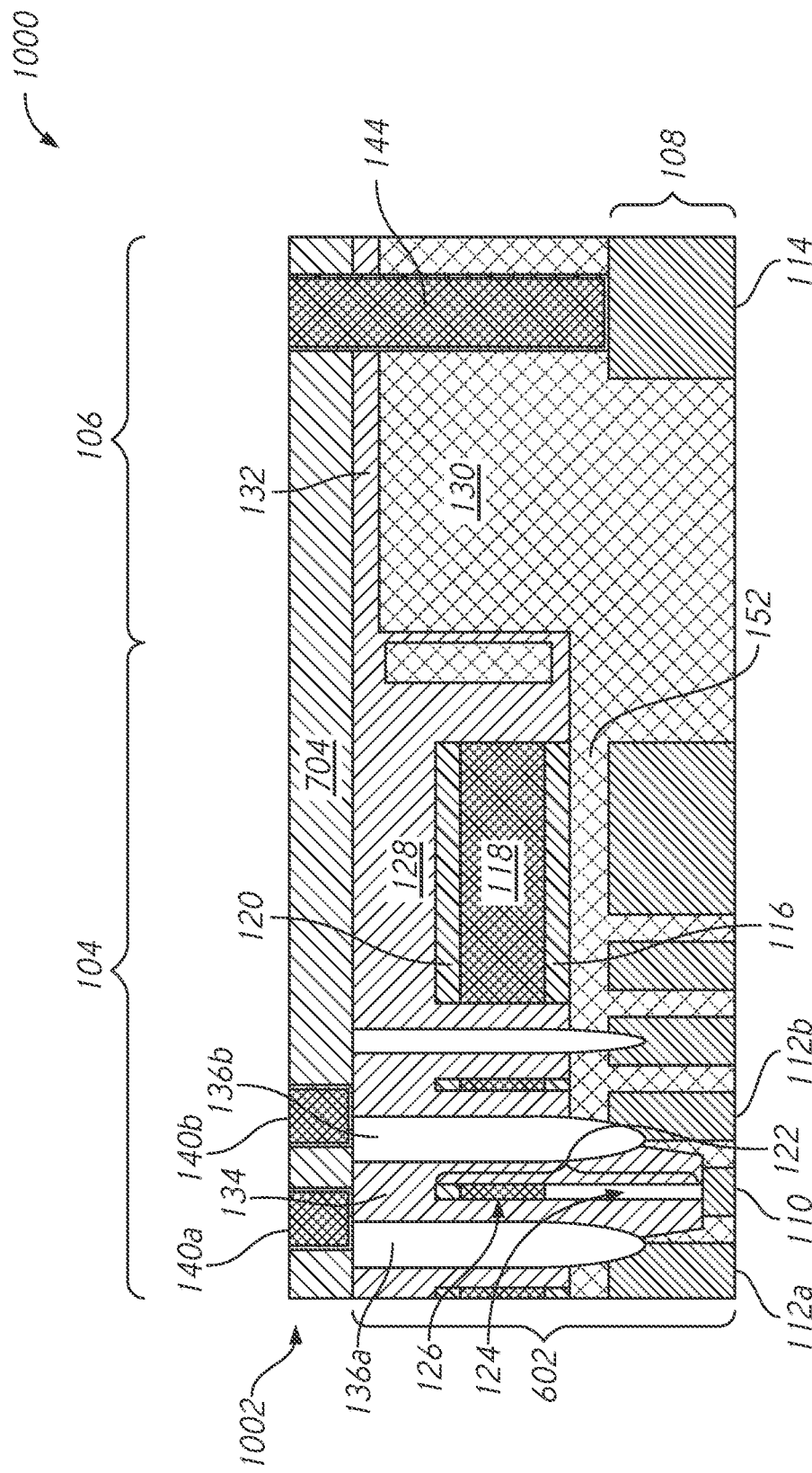
FIG. 10 is a diagram of a vertical cross-sectional view of one schematic structure of a portion of a semiconductor device in accordance with an embodiment of the present disclosure.

FIG. 10 is a diagram of a vertical cross-sectional view of one schematic structure of a portion 1002 of a semiconductor device 1000 in accordance with an embodiment of the present disclosure. In some embodiments, the portion 1002 of the semiconductor device 1000 may be an intermediate structure that is used to fabricate the portion 102 of the semiconductor device 100 of FIG. 1. In some embodiments, the portion 1002 of the semiconductor device 1000 may be fabricated by performing one or more fabrication processes on the portion 902 of the semiconductor device 900 of FIG. 9. After depositing the conductive material 904, excess conductive material above a top surface of the dielectric layer 704 may be removed by planarization, such as chemical mechanical polishing (CMP). Thus, the interconnects 140a and 140b may be formed in the dielectric layer 704. Each of interconnects 140a and 140b has a base on a top face of each corresponding capacitor contact of the plurality of capacitor contacts 136a and 136b. The interconnects 140a and 140b may be disposed on the capacitor contacts 136a and 136b with lateral offsets, respectively. In other words, a center of the base of each of the interconnects 140a and 140b is away from a center of the top face of each corresponding capacitor contacts 136a and 136b.

Figure 11:
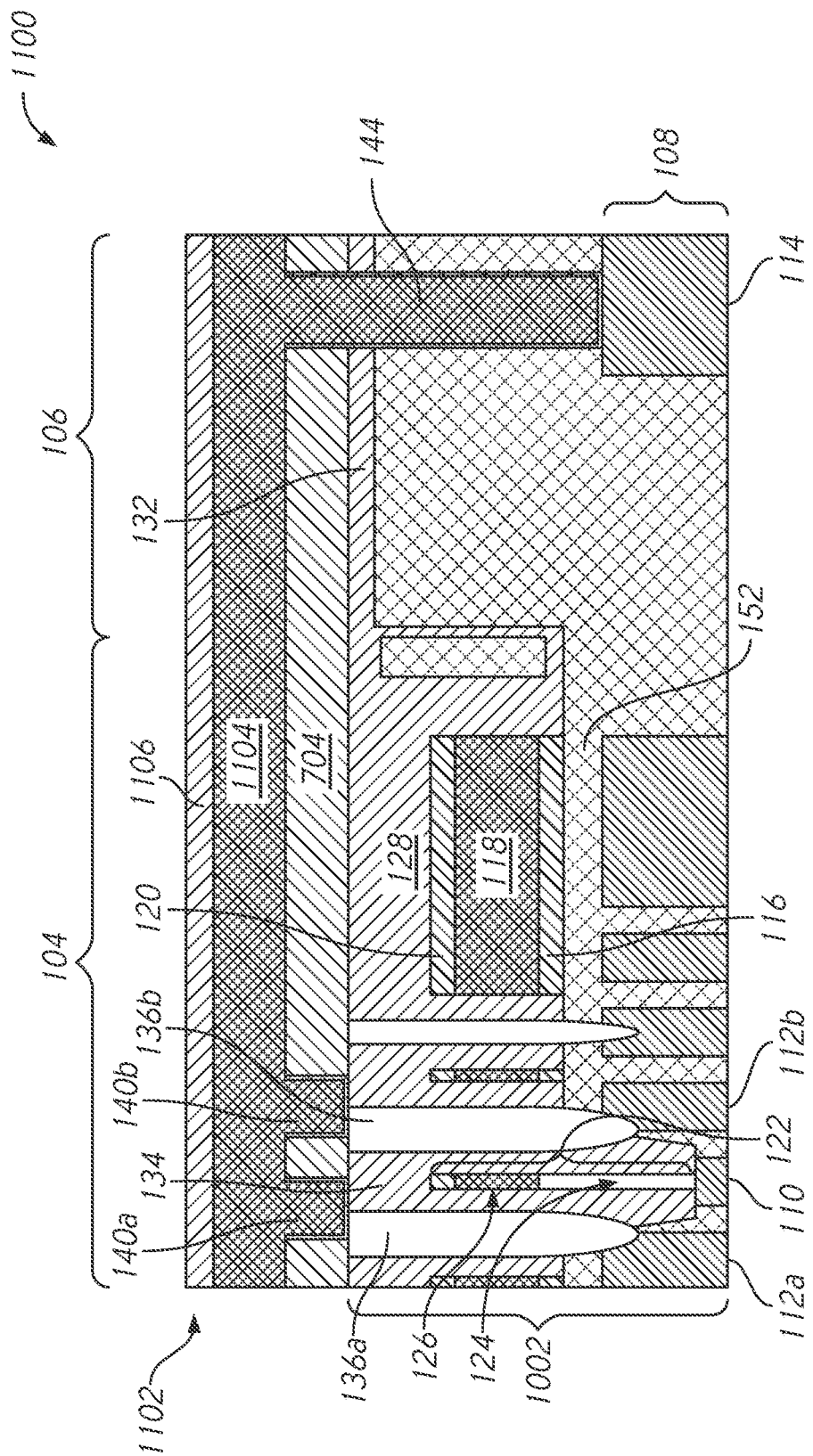
FIG. 11 is a diagram of a vertical cross-sectional view of one schematic structure of a portion of a semiconductor device in accordance with an embodiment of the present disclosure.

FIG. 11 is a diagram of a vertical cross-sectional view of one schematic structure of a portion 1102 of a semiconductor device 1100 in accordance with an embodiment of the present disclosure. In some embodiments, the portion 1102 of the semiconductor device 1100 may be an intermediate structure that is used to fabricate the portion 102 of the semiconductor device 100 of FIG. 1. In some embodiments, the portion 1102 of the semiconductor device 1100 may be fabricated by performing one or more fabrication processes on the portion 1002 of the semiconductor device 1000 of FIG. 10. The portion 1102 may include a conductive layer 1104 disposed on the dielectric layer 704 and the interconnects 140a and 140b of the portion 1002. In some embodiments, the conductive layer 1104 may be deposited by physical vapor deposition (PVD), for example to obtain a lower resistance compared to a conductive layer formed by CVD. In some embodiments, the conductive layer 1104 may include conductive material, such as tungsten (W). The portion 1102 may further include a dielectric layer 1106 disposed on the conductive layer 1104. In some embodiments, the dielectric layer 1106 may include dielectric material. The dielectric material may include, for example, silicon nitride (SiN).

Figure 12:
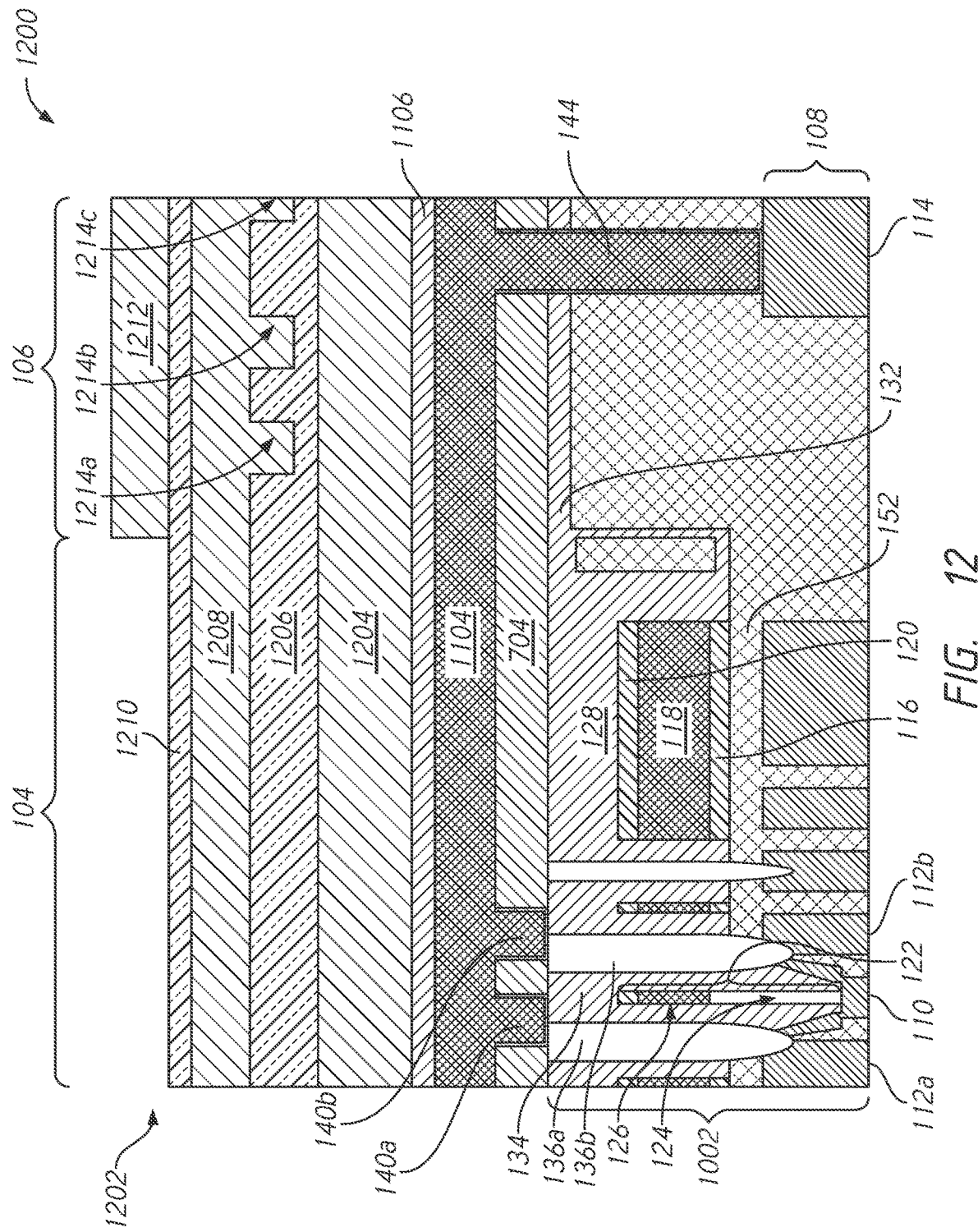
FIG. 12 is a diagram of a vertical cross-sectional view of one schematic structure of a portion of a semiconductor device in accordance with an embodiment of the present disclosure.

FIG. 12 is a diagram of a vertical cross-sectional view of one schematic structure of a portion 1202 of a semiconductor device 1200 in accordance with an embodiment of the present disclosure. In some embodiments, the portion 1202 of the semiconductor device 1200 may be an intermediate structure that is used to fabricate the portion 102 of the semiconductor device 100 of FIG. 1. In some embodiments, the portion 1202 of the semiconductor device 1200 may be fabricated by performing one or more fabrication processes on the portion 1102 of the semiconductor device 1100 of FIG. 11.

A photoresist 1204 may be disposed on the dielectric layer 1106. A coating 1206 may be disposed on the photoresist 1204. The coating 1206 may be anti-reflecting coating. The coating 1206 may include recesses 1214a to 1214c. The dielectric layer 1106 and the conductive layer 1104 under the recesses 1214a to 1214c may be removed by photolithography to form the interconnects 146a, 146b and 146c in FIG. 1. A photoresist 1208 may be disposed on the coating 1206 and a coating 1210 may be disposed on the photoresist 1208. The coating 1210 may be anti-reflecting coating. Another photoresist 1212 may be formed on the coating 1210 in the peripheral region 106. Because there is no photoresist above the 1210 in the memory array region 104, the dielectric layer 1106 and the conductive layer 1104 in the memory array region 104 may be removed by photolithography.

In some embodiments, the coatings 1206 and 1210 may include anti-reflecting material. For example, the anti-reflecting material may be silicon (Si), silicon oxide (SiO$_2$) and/or silicon carbide (SiC) or a mixture of any combination thereof. In some embodiments, a ratio of silicon (Si) may be greater than any other material in the coatings 1206 and 1210. The photoresists 1204, 1208 and 1212 may include silicon carbide (SiC), for example.

Figure 13:
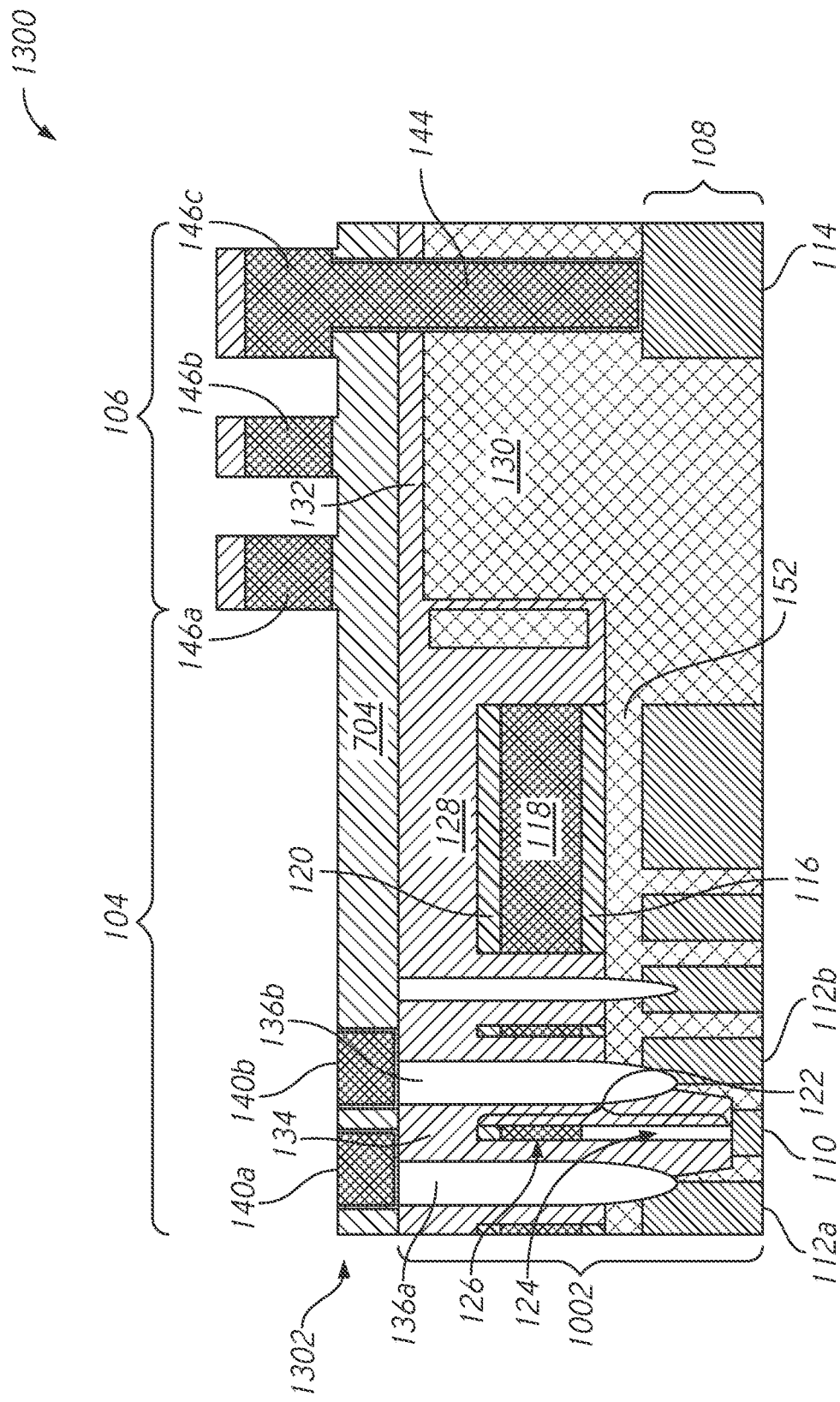
FIG. 13 is a diagram of a vertical cross-sectional view of one schematic structure of a portion of a semiconductor device in accordance with an embodiment of the present disclosure.

FIG. 13 is a diagram of a vertical cross-sectional view of one schematic structure of a portion 1302 of a semiconductor device 1300 in accordance with an embodiment of the present disclosure. In some embodiments, the portion 1302 of the semiconductor device 1300 may be an intermediate structure that is used to fabricate the portion 102 of the semiconductor device 100 of FIG. 1. In some embodiments, the portion 1302 of the semiconductor device 1300 may be fabricated by performing one or more fabrication processes on the portion 1202 of the semiconductor device 1200 of FIG. 12.

After the photolithography, the photoresists 1204, 1208 and 1212 and the coatings 1206 and 1210 may be removed, together with the portions of the dielectric layer 1106 and the conductive layer 1104. Thus, the interconnects 146a, 146b and 146c may be formed. The dielectric layer 1106 above the interconnects 146a, 146b and 146c may be left unremoved. The dielectric layer 704 not covered by the interconnects 146a, 146b and 146c may be removed until exposing top surfaces of the interconnects 140a and 140b. In some embodiments, top portions of the interconnects 140a and 140b may be removed. Thus, interfaces between the dielectric layer 704 and the interconnects 146a, 146b and 146c may be higher than the top surfaces of the interconnects 140a and 140b.

Figure 14:
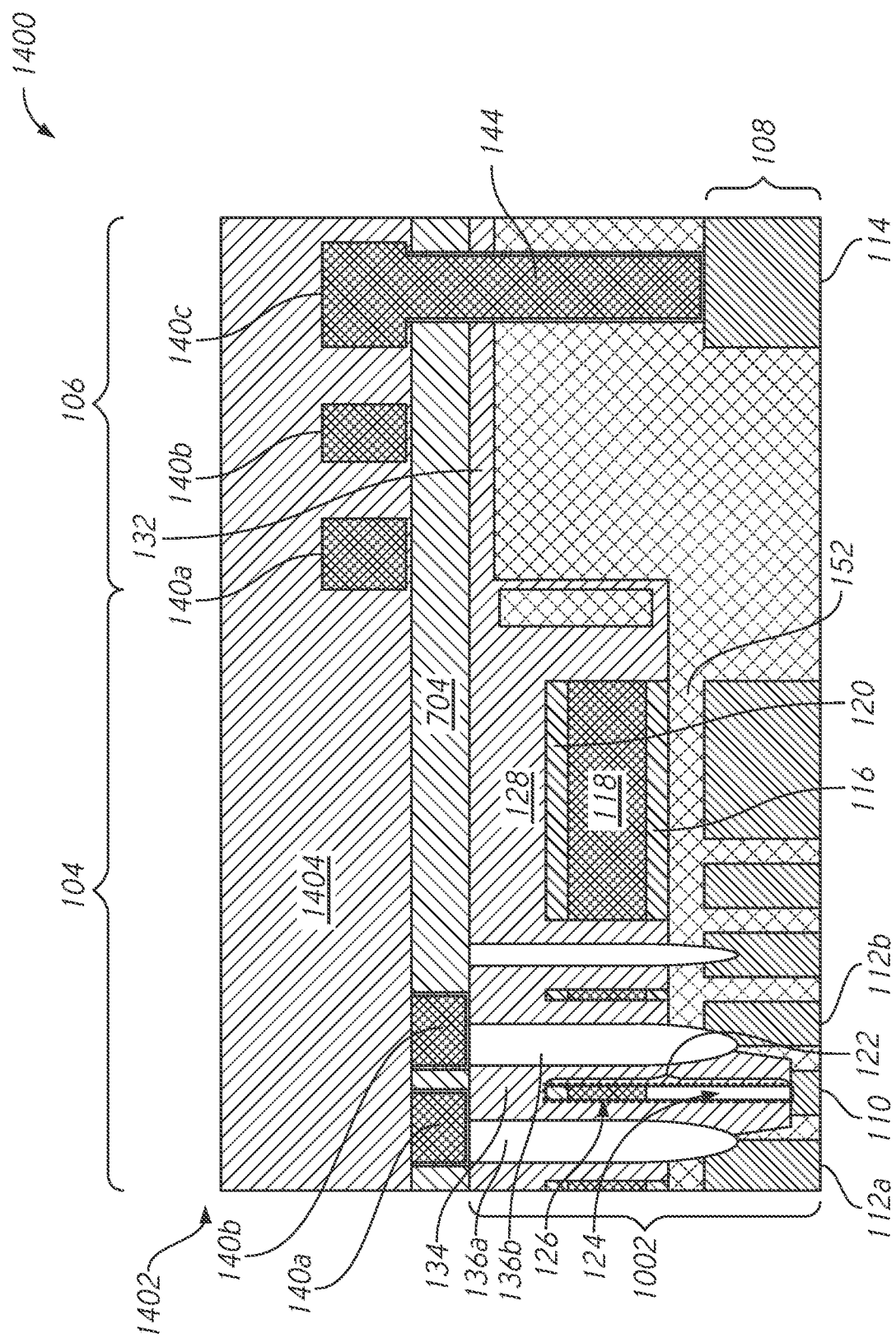
FIG. 14 is a diagram of a vertical cross-sectional view of one schematic structure of a portion of a semiconductor device in accordance with an embodiment of the present disclosure.

FIG. 14 is a diagram of a vertical cross-sectional view of one schematic structure of a portion 1402 of a semiconductor device 1400 in accordance with an embodiment of the present disclosure. In some embodiments, the portion 1402 of the semiconductor device 1400 may be an intermediate structure that is used to fabricate the portion 102 of the semiconductor device 100 of FIG. 1. In some embodiments, the portion 1402 of the semiconductor device 1400 may be fabricated by performing one or more fabrication processes on the portion 1302 of the semiconductor device 1300 of FIG. 13.

A dielectric layer 1404 may be formed on the portion 1302 of FIG. 13. In some embodiments, the dielectric layer 1404 may include dielectric material. The dielectric material may include, for example, silicon nitride (SiN). An opening may be formed in the dielectric layer 1404 above the interconnect 146c. The via 148 in FIG. 1 may be formed in the opening above the interconnect 146c. In some embodiments, conductive material may be deposited on the dielectric layer 1404. The conductive material may be deposited by physical vapor deposition (PVD), for example to obtain a lower resistance compared to a conductive layer formed by CVD. In some embodiments, the conductive material may include conductive material, such as tungsten (W). The conductive material may fill the opening above the interconnect 146c. The excessive conductive material not covering the via 148 above the dielectric layer 1404 may be removed. Thus, as shown in FIG. 1, the via 148 in the dielectric layer 1404 and the interconnect 150 on the via 148 and coupled to the via 148 may be formed.

As described above, redistribution layers (RDLs), such as the interconnects 140a and 140b above the capacitor contacts 136a and 136b, may be formed using the damascene process of depositing a dielectric layer (e.g., the dielectric layer 704), forming openings (e.g., the openings 804a and 804b) and filling the openings, instead of depositing a conductive layer and etching back an excessive portion of the conductive layer.

Figure 15:
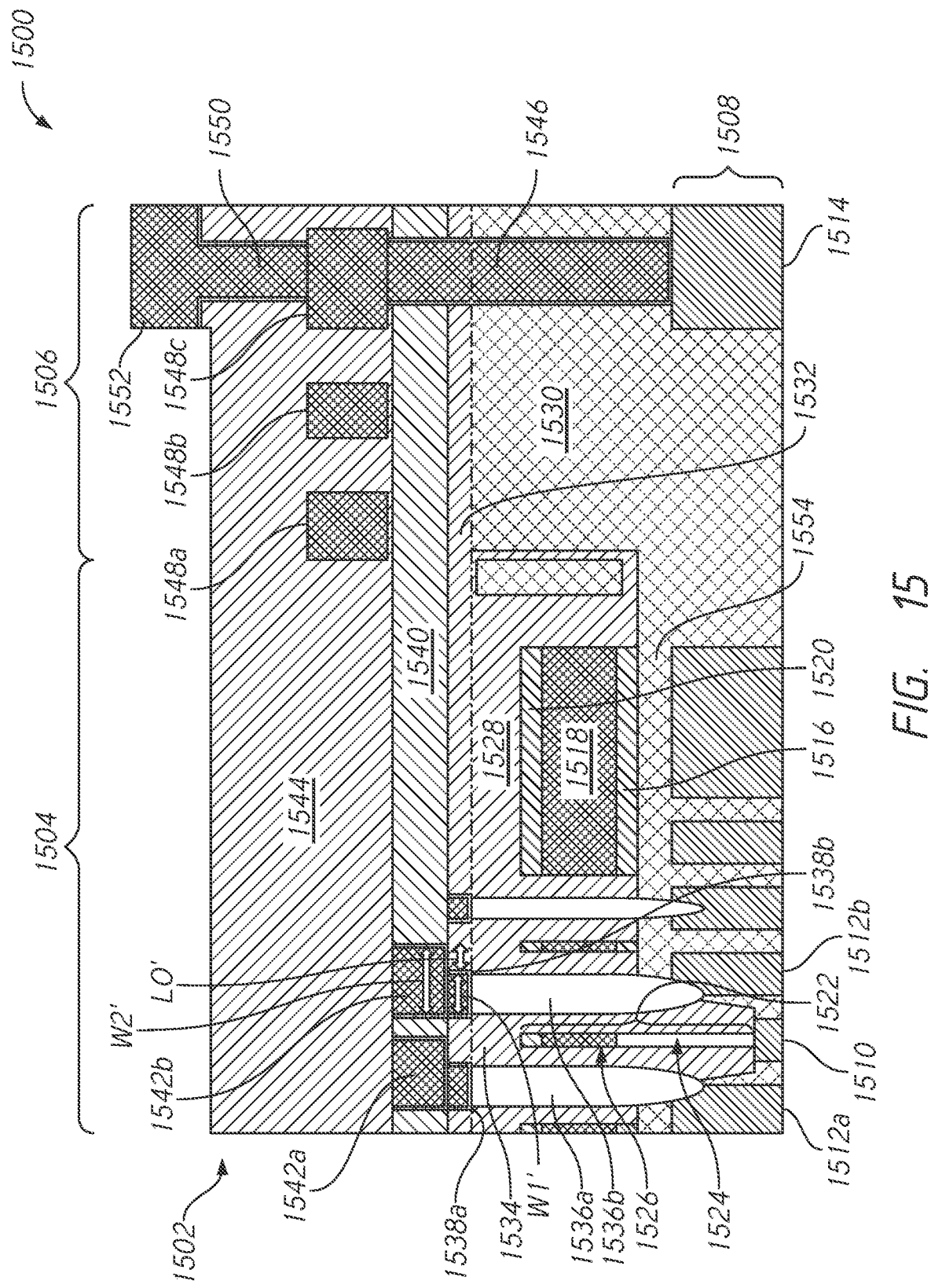
FIG. 15 is a diagram of a vertical cross-sectional view of one schematic structure of a portion of a semiconductor device in accordance with an embodiment of the present disclosure.

In some embodiments, each redistribution layer (RDL) may be formed as two interconnects of adjacent conductive layers coupled to each other. FIG. 15 is a diagram of a vertical cross-sectional view of one schematic structure of a portion 1502 of a semiconductor device 1500 in accordance with an embodiment of the present disclosure. In some embodiment, the semiconductor device 1500 may be a memory device (e.g., a dynamic random access memory (DRAM)) including memory cells, for example. Each memory cell may include a transistor and a capacitor. The portion 1502 may include the transistor, such as a metal-oxide-semiconductor field-effect transistor (MOSFET) in the DRAM, for example.

The portion 1502 includes portions of a memory array region 1504 and a peripheral region 1506 of the semiconductor device 1500. Memory cells may be disposed in the memory array region 1504 and peripheral circuits may be disposed in the peripheral region 1506. In some embodiments, the semiconductor device 1500 may include a substrate 1508 across the memory array region 1504 and the peripheral region 1506. The substrate 1508 may include an active region 1510, active regions 1512a and 1512b in the memory array region 1504. The substrate 1508 may include an active region 1514 in the peripheral region 1506. The portion 1502 may include an isolation structure 1554 covering the active regions 1510, 1512a, 1512b and 1514. The active regions 1510, 1512a, 1512b and 1514 may be isolated from one another by the isolation structure 1554. In some embodiments, the isolation structure 1554 may be shallow trench isolation (STI) including dielectric material. The portion 1502 may include a dielectric layer 1516 on the substrate 1508, a conductive layer 1518 on the dielectric layer 1516 and a dielectric layer 1520 on the conductive layer 1518 in the memory array region 1504. The portion 1502 may include a bit line structure 1522 on the active region 1510 of the substrate 1508. The bit line structure 1522 may include a bit line contact 1524 on the active region 1510 of the substrate 1508 and a bit line 1526 on the bit line contact 1524. In some embodiments, the bit line contact 1524 may be provided on a top surface of the substrate 1508. In some embodiments, the top surface of the substrate 1508 may have a height less than a thickness of the rest of the substrate 1508. In some embodiments, the bit line 1526 may be a portion of the conductive layer 1518. The portion 1502 may also include a dielectric layer 1528 above the dielectric layer 1520 in the memory array region 1504. The portion 1502 may also include a dielectric layer 1530 in the peripheral region 1506. The dielectric layer 1530 may have a top surface having a same height from the substrate 1508 as a height of a top surface of the dielectric layer 1528. The portion 1502 may include capacitor contacts 1536a and 1536b on the active regions 1512a and 1512b respectively. In some embodiments, lower portions of the capacitor contacts 1536a and 1536b may be in the substrate 1508. In some embodiments, top surfaces of the capacitor contacts 1536a and 1536b may have a same height from the substrate 1508 as top surfaces of the dielectric layers 1528 and 1530. The portion 1502 may further include an insulator 1534 around the bit structure 1522. The bit structure 1522 may be insulated from the capacitor contacts 1536a and 1536b by the insulator 1534.

The portion 1502 may include a dielectric layer 1532 across the memory array region 1504 and the peripheral region 1506. The dielectric layer 1532 may be disposed on the dielectric layers 1528 and 1530 and the capacitor contacts 1536a and 1536b. The portion 1502 may include interconnects 1538a and 1538b above the capacitor contacts 1536a and 1536b. The interconnects 1538a and 1538b may include conductive material. The portion 1502 may include a dielectric layer 1540 across the memory array region 1504 and the peripheral region 1506. In some embodiments, the dielectric layer 1540 may be disposed on the dielectric layer 1532, the interconnects 1538a and 1538b and the insulator 1534 between the interconnects 1538a and 1538b. The portion 1502 may include interconnects 1542a and 1542b in the dielectric layer 1540. The interconnects 1542a and 1542b may be disposed on the interconnects 1538a and 1538b. Thus the interconnects 1538a and 1538b may be disposed between the capacitor contacts 1536a and 1536b and the interconnects 1542a and 1542b, respectively. The interconnects 1542a and 1542b may be disposed on the interconnects 1538a and 1538b on the capacitor contacts 1536a and 1536b with lateral offsets LO', respectively. In some embodiments, each of the interconnects 1542a and 1542b may have a width W2' that is greater than a width W1' of each of the interconnects 1538a and 1538b and upper portions of the capacitor contacts 1536a and 1536b. The interconnects 1542a and 1542b may be coupled to the interconnects 1538a and 1538b, respectively.

The portion 1502 may also include a via 1546 disposed on the active region 1514. The via 1546 may be disposed through the dielectric layers 1530, 1532 and 1540. The portion 1502 may include a dielectric layer 1544 across the memory array region 1504 and the peripheral region 1506. The portion 1502 may include interconnects 1548a, 1548b and 1548c in the dielectric layer 1544. The interconnect 1548c may be disposed on the via 1546. The portion 1502 may also include a via 1550 in the dielectric layer 1544. The via 1550 may be disposed on the interconnect 1548c. The portion 1502 may further include an interconnect 1552 disposed on the dielectric layer 1544 and the via 1550. Additional, fewer, and/or different components may be included in other examples.

The following describes methods of forming apparatuses, such as a semiconductor memory device 1500 according to the embodiment with reference to FIG. 16 to FIG. 21. In some embodiment, conductive layers may be redistribution layers (RDLs). The dimensions and the ratios of dimensions of each portion in each drawing do not necessarily coincide with the dimensions and the ratios of dimensions of the actual semiconductor device.

Forming the bit line structure 1522 and the capacitor contacts 1536a and 1536b on the active regions 1510, 1512a and 1512b of the substrate 1508 in FIG. 15 may be similar to forming the bit line structure 122 and the capacitor contacts 136a and 136b on the active regions 110, 112a and 112b of the substrate 108 previously described with reference to and shown in FIGS. 2-6, thus the description of forming the bit line structure 1522 and the capacitor contacts 1536a and 1536b is omitted for brevity.

Figure 16:
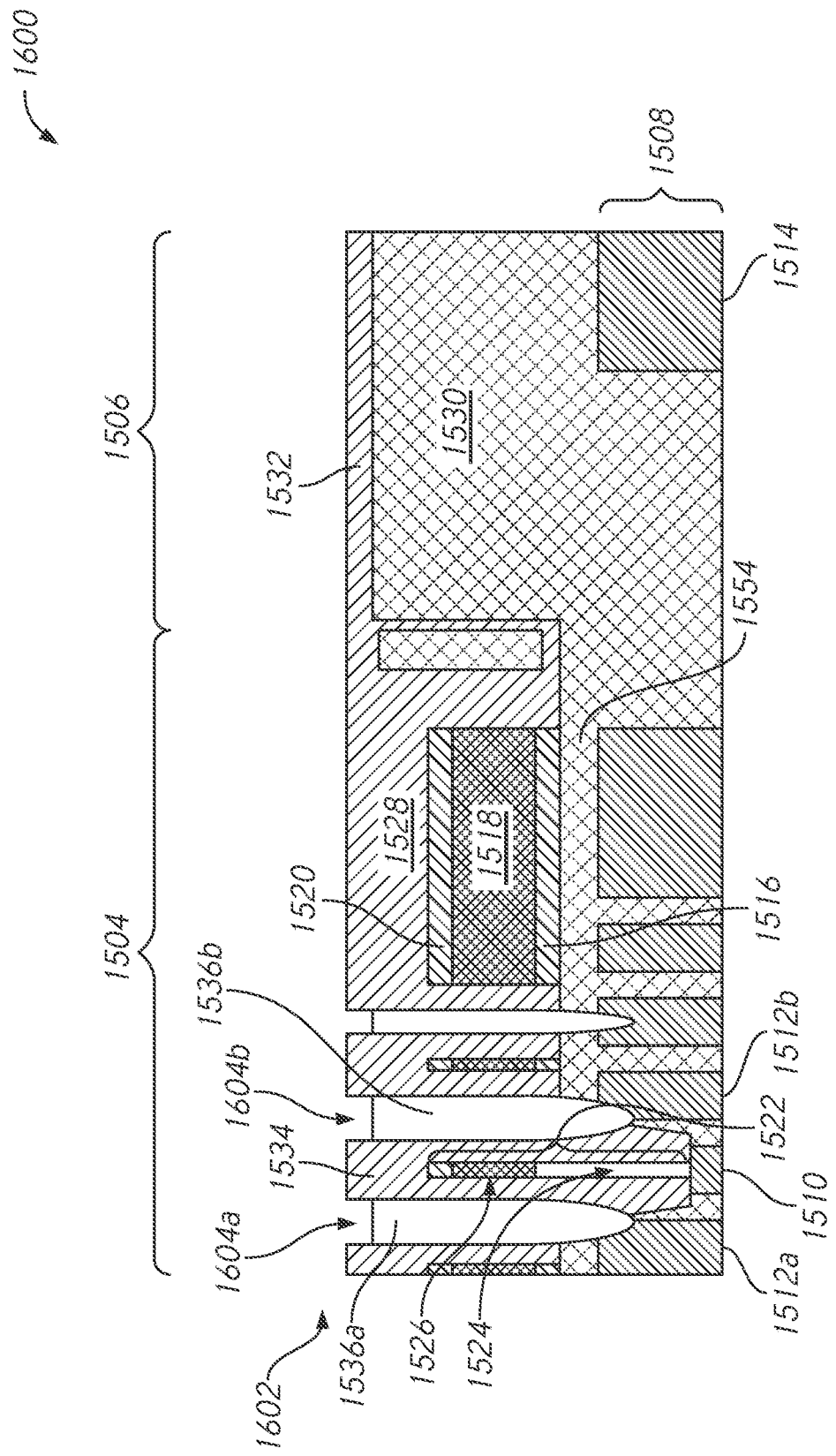
FIG. 16 is a diagram of a vertical cross-sectional view of one schematic structure of a portion of a semiconductor device in accordance with an embodiment of the present disclosure.

FIG. 16 is a diagram of a vertical cross-sectional view of one schematic structure of a portion 1602 of a semiconductor device 1600 in accordance with an embodiment of the present disclosure. In some embodiments, the portion 1602 of the semiconductor device 1600 may be an intermediate structure that is used to fabricate the portion 1502 of the semiconductor device 1500 of FIG. 15. The portion 1602 includes portions of a memory array region 1504 and a peripheral region 1506 of the semiconductor device 200. Openings 1604a and 1604b may be provided in the memory array region 1504 of the dielectric layer 1532. In some embodiments, the openings 1604a and 1604b may be formed using photopatterning and dry-etching. The dry-etching in the memory array region 104 may be performed to remove top portions of the capacitor contacts 1536a and 1536b. Thus, the openings 1604a and 1604b may be disposed above remaining portions of the capacitor contacts 1536a and 1536b thereof, respectively. In some embodiments, through the openings 1604a and 1604b, ion implantation, such as ion implantation of germanium (Ge) into the capacitor contacts 1536a and 1536b.

Figure 17:
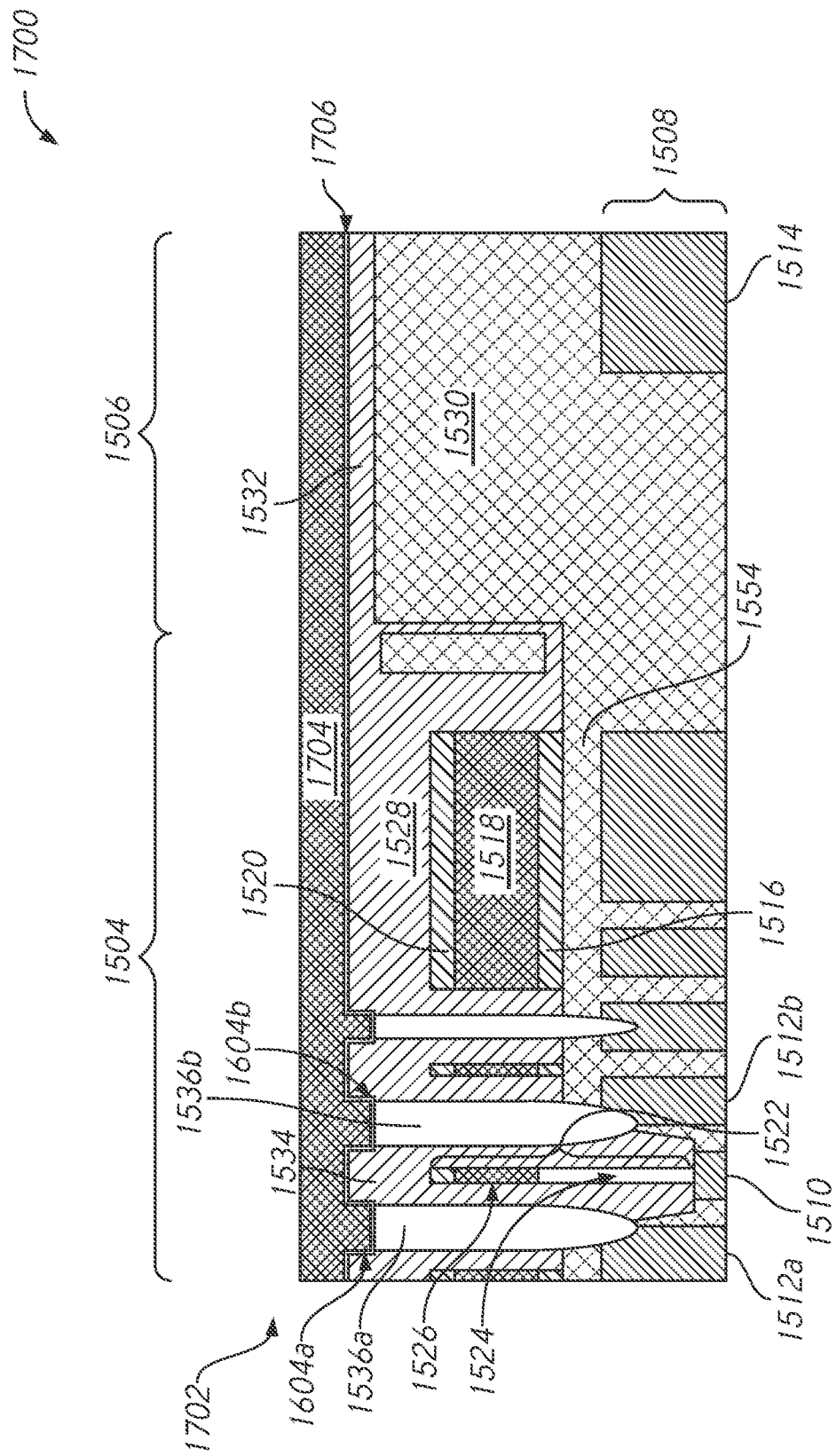
FIG. 17 is a diagram of a vertical cross-sectional view of one schematic structure of a portion of a semiconductor device in accordance with an embodiment of the present disclosure.

FIG. 17 is a diagram of a vertical cross-sectional view of one schematic structure of a portion 1702 of a semiconductor device 1700 in accordance with an embodiment of the present disclosure. In some embodiments, the portion 1702 of the semiconductor device 1700 may be an intermediate structure that is used to fabricate the portion 1502 of the semiconductor device 1500 of FIG. 15. In some embodiments, the portion 1702 of the semiconductor device 1700 may be fabricated by performing one or more fabrication processes on the portion 1602 of the semiconductor device 1600 of FIG. 16. The portion 1702 may include conductive material 1704 disposed on the dielectric layer 1532 and inside the openings 1604a and 1604b. The interconnects 1538a and 1538b in FIG. 15 may be included in the conductive material 1704. In some embodiments, the conductive material 1704 may be deposited by chemical vapor deposition (CVD). In some embodiments, the conductive material may include tungsten (W). In some embodiment, a barrier layer 1706 may be disposed on the dielectric layer 1532 and inside the openings 1604a and 1604b, prior to depositing the conductive material 1704. Forming the barrier layer 1706 may be similar to forming the barrier layer 906, previously described with reference to and shown in FIG. 9, thus the description of forming the barrier layer is omitted for brevity.

Figure 18:
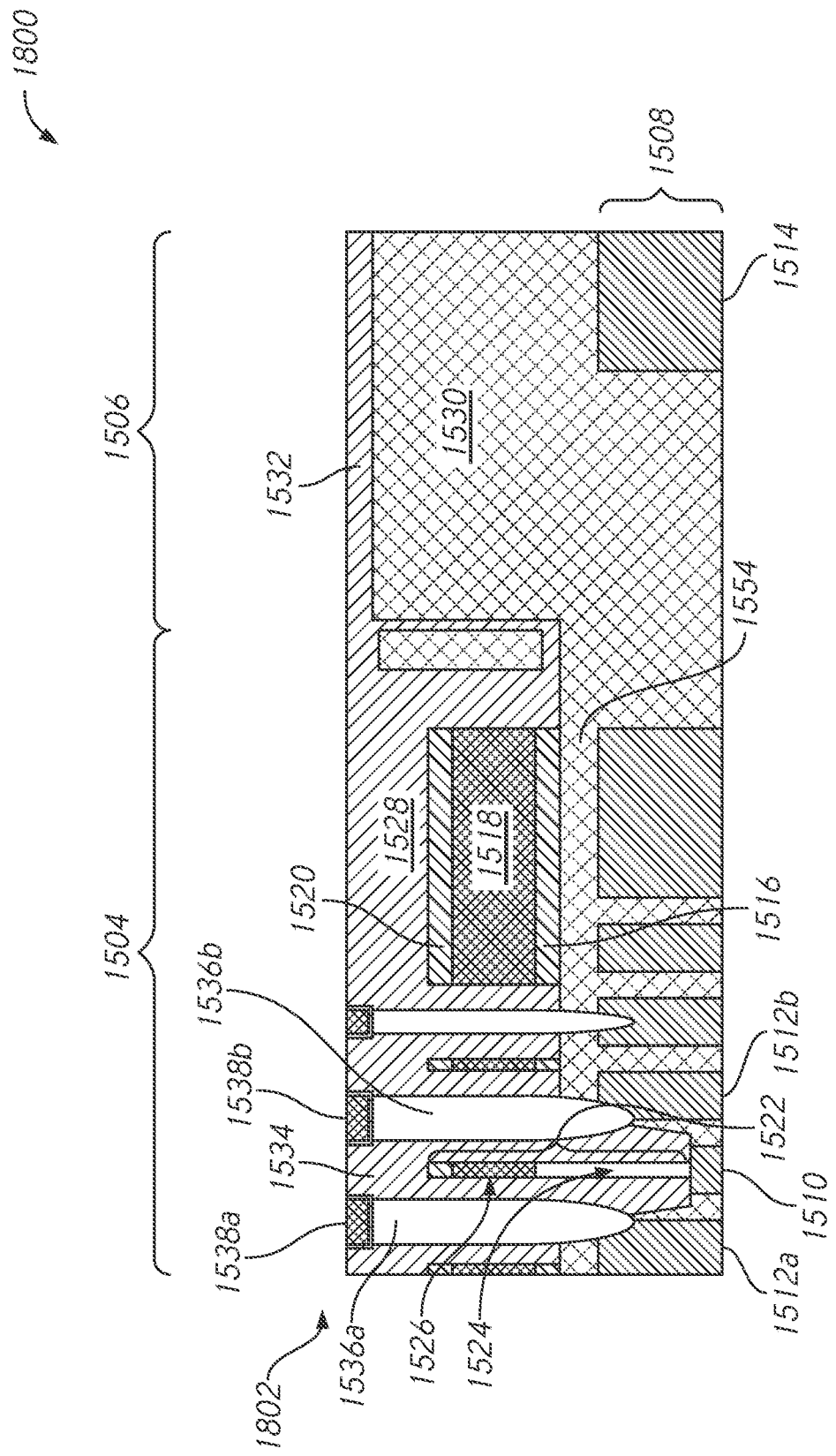
FIG. 18 is a diagram of a vertical cross-sectional view of one schematic structure of a portion of a semiconductor device in accordance with an embodiment of the present disclosure.

FIG. 18 is a diagram of a vertical cross-sectional view of one schematic structure of a portion 1802 of a semiconductor device 1800 in accordance with an embodiment of the present disclosure. In some embodiments, the portion 1802 of the semiconductor device 1800 may be an intermediate structure that is used to fabricate the portion 1502 of the semiconductor device 1500 of FIG. 15. In some embodiments, the portion 1802 of the semiconductor device 1800 may be fabricated by performing one or more fabrication processes on the portion 1702 of the semiconductor device 1700 of FIG. 17. After depositing the conductive material 1704, excess conductive material above a top surface of the dielectric layer 1532 may be removed by planarization, such as chemical mechanical polishing (CMP). Thus, the interconnects 1538a and 1538b may be formed in the dielectric layer 1532. The interconnects 1538a and 1538b may be disposed on the capacitor contacts 1536a and 1536b, respectively, to replace the top portions of the capacitor contacts 1536a and 1536b removed.

Figure 19:
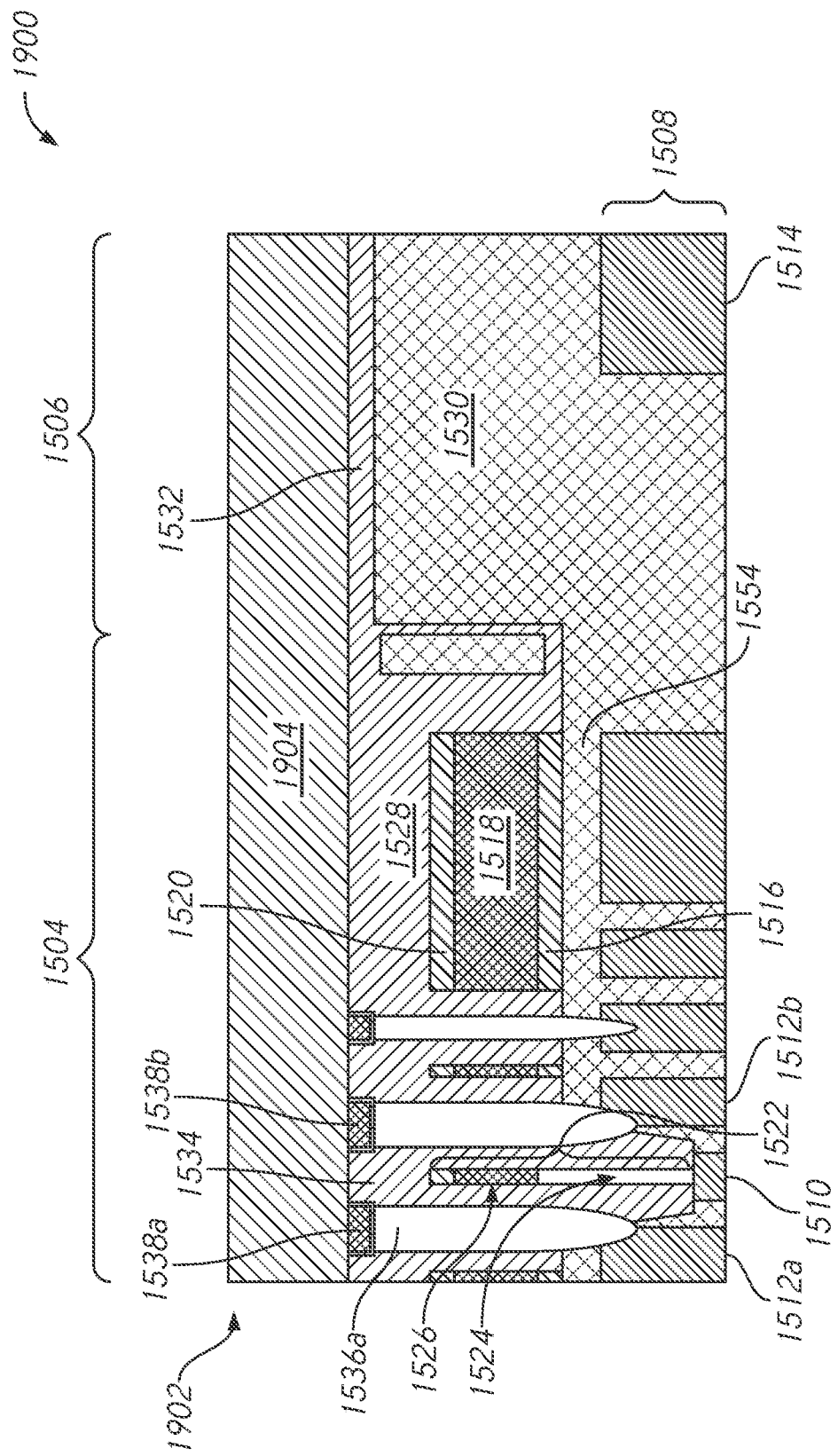
FIG. 19 is a diagram of a vertical cross-sectional view of one schematic structure of a portion of a semiconductor device in accordance with an embodiment of the present disclosure.

FIG. 19 is a diagram of a vertical cross-sectional view of one schematic structure of a portion 1902 of a semiconductor device 1900 in accordance with an embodiment of the present disclosure. In some embodiments, the portion 1902 of the semiconductor device 1900 may be an intermediate structure that is used to fabricate the portion 1502 of the semiconductor device 1500 of FIG. 15. In some embodiments, the portion 1902 of the semiconductor device 1900 may be fabricated by performing one or more fabrication processes on the portion 1802 of the semiconductor device 1800 of FIG. 18. The portion 1902 may include a dielectric layer 1904 formed on the portion 1802 of FIG. 18. In some embodiments, the dielectric layer 1904 may be disposed on the dielectric layer 1532 and the interconnects 1538a and 1538b and the insulator 134 between the interconnects 1538a and 1538b. The dielectric layer 1904 may include dielectric material. The dielectric material may include, for example, silicon nitride (SiN). The dielectric material may be deposited by physical vapor deposition (PVD) or chemical vapor deposition (CVD). In some embodiment, the dielectric layer 1904 may be deposited by atomic layer deposition (ALD).

Figure 20:
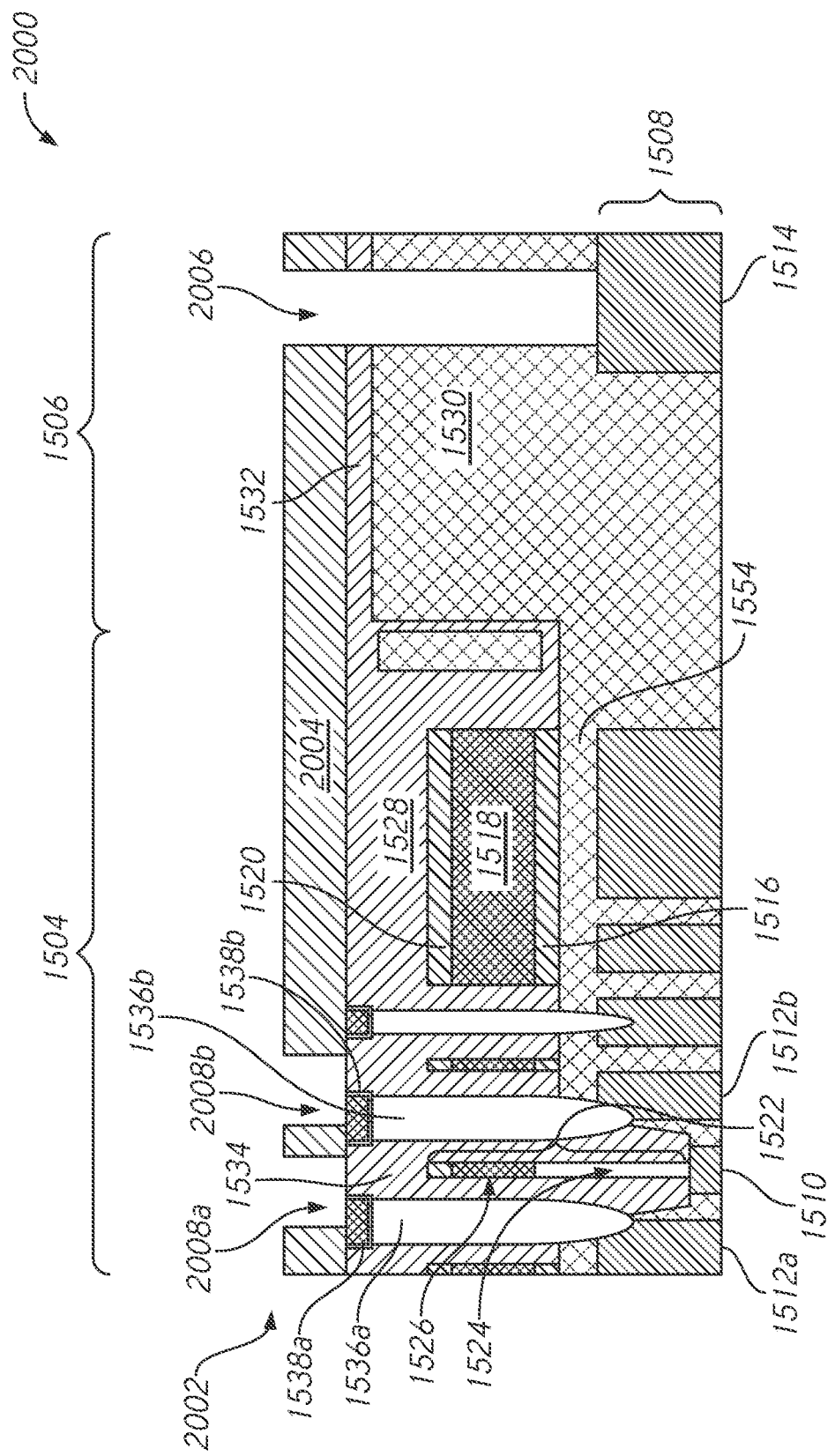
FIG. 20 is a diagram of a vertical cross-sectional view of one schematic structure of a portion of a semiconductor device in accordance with an embodiment of the present disclosure.

FIG. 20 is a diagram of a vertical cross-sectional view of one schematic structure of a portion 2002 of a semiconductor device 2000 in accordance with an embodiment of the present disclosure. In some embodiments, the portion 2002 of the semiconductor device 2000 may be an intermediate structure that is used to fabricate the portion 1502 of the semiconductor device 1500 of FIG. 15. In some embodiments, the portion 2002 of the semiconductor device 2000 may be fabricated by performing one or more fabrication processes on the portion 1902 of the semiconductor device 1900 of FIG. 19. A top portion of the dielectric layer 1904 may be removed to form a dielectric layer 2004. Openings 2008a and 2008b may be provided in the memory array region 1504 of the dielectric layer 2004. In some embodiments, the openings 2008a, and 2008b may be formed using photopatterning and dry-etching. The photopatterning may be performed to provide a pattern over the dielectric layer 1904. The pattern allows etching the dielectric layer 2004 with lateral offsets from the interconnects 1538a and 1538b. The dry-etching of the dielectric layer 2004 in the memory array region 1504 may be performed until the interconnects 1538a and 1538b are exposed. Thus, the openings 2008a and 2008b may be disposed above the interconnects 1538a and 1538b with lateral offsets, respectively. In some embodiments, through the openings 2008a and 2008b, ion implantation, such as ion implantation of germanium (Ge) into the capacitor contacts 1536a and 1536b may be performed.

An opening 2006 may be formed in the peripheral region 1506 through the dielectric layers dielectric layers 2004, 1532 and 1530 above the active region 1514. In some embodiments, a top surface of the dielectric layer 2004 and inside the opening 2008a and 2008b may be covered by a mask. In some embodiments, amorphous carbon material, such as diamond-like carbon, may be deposited by chemical vapor deposition (CVD) to be the mask. The dry-etching in the peripheral region 1506 may be performed to etch through the amorphous carbon material and dielectric layers 2004, 1532 and 1530 until the active region 1514 is exposed. Thus, the opening 2006 above the active region 1514 may be formed.

Figure 21:
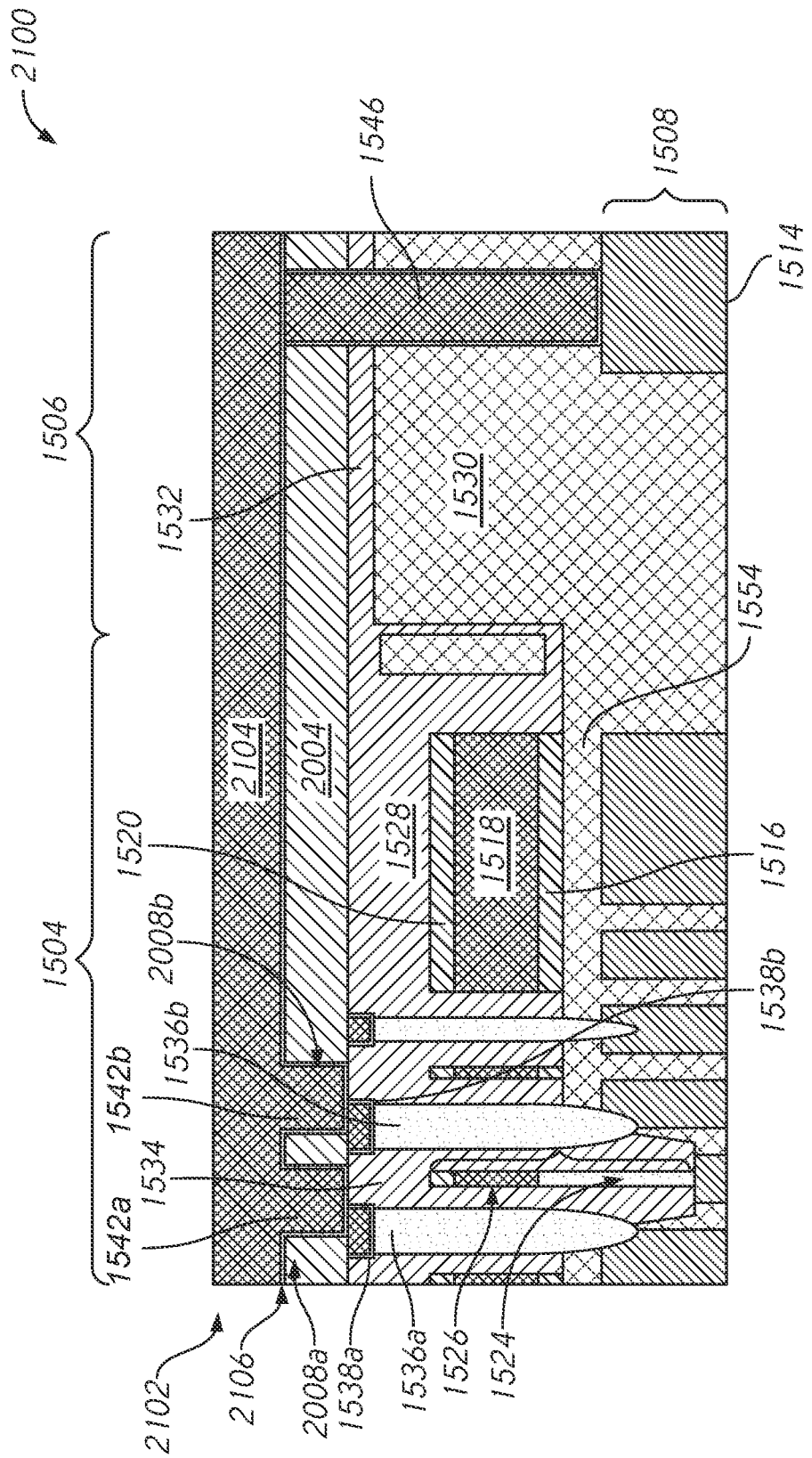
FIG. 21 is a diagram of a vertical cross-sectional view of one schematic structure of a portion of a semiconductor device in accordance with an embodiment of the present disclosure.

FIG. 21 is a diagram of a vertical cross-sectional view of one schematic structure of a portion 2102 of a semiconductor device 2100 in accordance with an embodiment of the present disclosure. In some embodiments, the portion 2102 of the semiconductor device 2100 may be an intermediate structure that is used to fabricate the portion 1502 of the semiconductor device 1500 of FIG. 15. In some embodiments, the portion 2102 of the semiconductor device 2100 may be fabricated by performing one or more fabrication processes on the portion 2002 of the semiconductor device 2000 of FIG. 20. In the openings 2008a and 2008b, interconnects 1542a and 1542b may be formed respectively. In the opening 2006, a via 1546 may be formed. In some embodiments, the interconnects 1542a and 1542b may be coupled to the interconnects 1538a and 1538b, respectively. The interconnects 1542a and 1542b may be disposed on the interconnects 1538a and 1538b with lateral offsets, respectively. The via 1546 may be coupled to the active region 1514. The interconnects 1542a and 1542b and the via 1546 may include conductive material that is the same conductive material as the conductive material included in the interconnects 1538a and 1538b. The conductive material may include, for example, tungsten (W).

In order to form the interconnects 1542a and 1542b and the via 1546, a barrier layer 2106 covering a top surface of the dielectric layer 2004 and inner surfaces of the openings 2008a, 2008b and 2006 may be formed. In some embodiments, the barrier layer 2106 in the openings 2008a and 2008b may also be formed on the interconnects 1538a and 1538b, respectively. The barrier layer 2106 in the opening 2006 may also be formed on the active region 1514. In some embodiments, the barrier layer 2106 may be deposited concurrently by physical vapor deposition (PVD) or chemical vapor deposition (CVD). In some embodiment, the barrier layer 2106 may include conductive material, such as titanium nitride (TiN) or titanium (Ti), for example. The portion 2102 may include conductive material 2104 disposed on the barrier layer 2106. The interconnects 1542a and 1542b and the via 1546 may be included in the conductive material 2104. In some embodiments, the conductive material 2104 may be deposited by chemical vapor deposition (CVD). In some embodiments, the conductive material may include tungsten (W). After depositing the conductive material 2104, excess conductive material above a top surface of the dielectric layer 2004 may be removed by planarization, such as chemical mechanical polishing (CMP). Thus, the interconnects 1542a and 1542b and the via 1546 may be formed in the dielectric layer 2004.

Forming the interconnects 1548a, 1548b and 1548c and the via 1550 above the interconnect 1548c in the dielectric layer 1544, and forming the interconnect 1552 above the via 1550 in FIG. 15 may be similar to forming the interconnects 146a, 146b and 146c in the dielectric layer 142, and forming interconnect 150 above the via 148 previously described with reference to and shown in FIGS. 11-14, thus the description of forming the interconnects 1548a, 1548b and 1548c, the via 1550 and the interconnect 1552 is omitted for brevity.

As described above, each redistribution layer (RDL) may be formed as two interconnects of adjacent conductive layers, such as the interconnects 1538a and 1542a, or the interconnects 1538b and 1542b, coupled to each other. Because there is no lateral offset between the capacitor contact 1536a and the interconnect 1538a or be between the capacitor contact 1536b and the interconnect 1538b, conduction efficiency at an interface between the capacitor contact 1536a and the interconnect 1538a or an interface between the capacitor contact 1536b and the interconnect 1538b may be increased. Resistance at an interface between the interconnects 1538a and 1542a or an interface between the interconnects 1538b and 1542b may be negligible because the interconnects 1538a, 1538b, 1542a and 1542b include the same conductive material. Thus, the conduction efficiency among the capacitor contact 1536a and the interconnects 1538a and 1542a and the conduction efficiency among the capacitor contact 1536b and the interconnects 1538b and 1542b may be increased.

Various embodiments of forming interconnects, such as redistribution layers (RDLs), above capacitor contacts have been disclosed. The interconnects above the capacitor contacts may be formed using a damascene process, forming a dielectric layer above the capacitor contacts, forming openings with lateral offset from the capacitor contacts in the dielectric layer, and filling the conductive material in the openings using physical vapor deposition (PVD), such as sputtering.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus, comprising:
a plurality of capacitor contacts on an active region of a substrate, each capacitor contact of the plurality of capacitor contacts has a bottom portion in the substrate and extends in a first dielectric layer above the substrate;
a second dielectric layer above the plurality of capacitor contacts and above the first dielectric layer, wherein there is no portion of the first dielectric layer that extends above any portion of the second dielectric layer in a direction away from the substrate;
a plurality of openings through the second dielectric layer, each opening of the plurality of openings extends from an upper surface of the second dielectric layer to a bottom surface of the second dielectric layer and reaches the first dielectric layer below the second dielectric layer; and
a plurality of interconnects as redistribution layers in the plurality of openings through the second dielectric layer,
wherein each interconnect of the plurality of interconnects is disposed above each corresponding capacitor contact of the plurality of capacitor contacts with a lateral offset such that a center of a base of each interconnect is away from a center of a top of each corresponding capacitor contact in a horizontal direction.

2. The apparatus of claim 1, wherein
the plurality of interconnects are a plurality of first interconnects, and
the apparatus further comprises a plurality of second interconnects between the plurality of corresponding capacitor contacts and the plurality of corresponding first interconnects.

3. The apparatus of claim 2, wherein each first interconnect of the plurality of first interconnects is disposed on each corresponding second interconnect of the plurality of second interconnects with the lateral offset.

4. The apparatus of claim 2, wherein
the plurality of capacitor contacts comprise first conductive material, and
the plurality of first interconnects and the plurality of second interconnects comprise second conductive material different from the first conductive material.

5. The apparatus of claim 1, wherein a width of each interconnect of the plurality of interconnects is constant and is greater than a width of each capacitor contact of the plurality of capacitor contacts.

* * * * *